United States Patent
Hayakawa et al.

(10) Patent No.: US 8,995,171 B2
(45) Date of Patent: Mar. 31, 2015

(54) DESIGNING METHOD OF NON-VOLATILE MEMORY DEVICE, MANUFACTURING METHOD OF NON-VOLATILE MEMORY DEVICE, AND NON-VOLATILE MEMORY DEVICE

(71) Applicant: Panasonic Corporation, Osaka (JP)

(72) Inventors: Yukio Hayakawa, Kyoto (JP); Kiyotaka Tsuji, Osaka (JP); Shinichi Yoneda, Kyoto (JP); Akifumi Kawahara, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/123,458

(22) PCT Filed: Apr. 3, 2013

(86) PCT No.: PCT/JP2013/002314
§ 371 (c)(1),
(2) Date: Dec. 2, 2013

(87) PCT Pub. No.: WO2013/150791
PCT Pub. Date: Oct. 10, 2013

(65) Prior Publication Data
US 2014/0146594 A1    May 29, 2014

(30) Foreign Application Priority Data

Apr. 4, 2012    (JP) .................. 2012-085837

(51) Int. Cl.
| | | |
|---|---|---|
| *G11C 13/00* | (2006.01) | |
| *H01L 45/00* | (2006.01) | |
| *H01L 27/24* | (2006.01) | |
| *G06F 17/50* | (2006.01) | |
| *G11C 5/06* | (2006.01) | |

(52) U.S. Cl.
CPC ........ *G11C 13/0002* (2013.01); *G11C 13/0007* (2013.01); *G11C 13/0069* (2013.01);
(Continued)

(58) Field of Classification Search
CPC .......................... G11C 13/0069; G11C 11/161
USPC .................................................. 365/148, 158
See application file for complete search history.

(56) References Cited

U.S. PATENT DOCUMENTS

2004/0202041 A1    10/2004    Hidenori
2010/0013512 A1*    1/2010    Hargan et al. ................ 324/765
(Continued)

FOREIGN PATENT DOCUMENTS

JP    2004-319587 A    11/2004
JP    2011-034637 A    2/2011
(Continued)

OTHER PUBLICATIONS

International Search Report issued in PCT/JP2013/002314, dated Jul. 9, 2013, with English translation.

*Primary Examiner* — Michael Tran
(74) *Attorney, Agent, or Firm* — McDermott Will & Emery LLP

(57) ABSTRACT

A method of designing a cross-point non-volatile memory device including memory elements arranged in (N×M) matrix, each of the memory elements including a variable resistance element and a bidirectional current steering element connected in series with the variable resistance element, the method comprises the step of: when an absolute value of a low-resistance state writing voltage is VR and an absolute value of a current flowing through the variable resistance element having changed to a low-resistance state by application of the low-resistance state writing voltage to both ends of the variable resistance element in a high-resistance state is $I_{on}$, and a relationship between a voltage $V_0$ applied to both ends of the bidirectional current steering element and a current I flowing through the bidirectional current steering element is approximated as $|V_0|=a \times Log(I)+b$, deciding N, M, VR, $I_{on}$, a, and b such that $b-VR/2 > a \times [Log\{(N-1) \times (M-1)\} - Log(I_{on})]$ is satisfied (S101).

14 Claims, 20 Drawing Sheets

(52) U.S. Cl.
CPC *G11C2013/0073* (2013.01); *G11C 2013/0078* (2013.01); *G11C 2213/15* (2013.01); *H01L 45/04* (2013.01); *H01L 45/146* (2013.01); *H01L 45/1666* (2013.01); *H01L 27/2409* (2013.01); *H01L 27/2463* (2013.01); *G06F 17/5068* (2013.01); *G11C 5/063* (2013.01); *H01L 45/16* (2013.01)
USPC .......................................... 365/148; 365/158

(56) References Cited

U.S. PATENT DOCUMENTS

| | | | |
|---|---|---|---|
| 2010/0172171 A1 | 7/2010 | Azuma et al. | |
| 2010/0193760 A1 | 8/2010 | Takagi et al. | |
| 2011/0026299 A1 | 2/2011 | Kanno et al. | |
| 2011/0044088 A1* | 2/2011 | Muraoka et al. | 365/148 |
| 2011/0164447 A1 | 7/2011 | Arita et al. | |
| 2011/0233511 A1* | 9/2011 | Kawashima et al. | 257/4 |
| 2011/0249486 A1 | 10/2011 | Azuma et al. | |
| 2011/0303958 A1* | 12/2011 | Matsuo et al. | 257/314 |
| 2012/0081946 A1* | 4/2012 | Kawabata et al. | 365/148 |
| 2012/0205608 A1* | 8/2012 | Yamauchi et al. | 257/4 |
| 2012/0292586 A1* | 11/2012 | Yamauchi et al. | 257/4 |
| 2014/0077149 A1* | 3/2014 | Chen et al. | 257/5 |

FOREIGN PATENT DOCUMENTS

| | | |
|---|---|---|
| WO | 2008-149493 A1 | 12/2008 |
| WO | 2009-011113 A1 | 1/2009 |
| WO | 2010-032470 A1 | 3/2010 |

* cited by examiner

US 8,995,171 B2

DESIGNING METHOD OF NON-VOLATILE MEMORY DEVICE, MANUFACTURING METHOD OF NON-VOLATILE MEMORY DEVICE, AND NON-VOLATILE MEMORY DEVICE

RELATED APPLICATIONS

This application is the U.S. National Phase under 35 U.S.C. §371 of International Application No. PCT/JP2013/002314, filed on Apr. 3, 2013, which in turn claims the benefit of Japanese Application No. 2012-085837, filed on Apr. 4, 2012, the disclosures of which Applications are incorporated by reference herein.

TECHNICAL FIELD

The present invention relates to a designing method of a non-volatile memory device, a manufacturing method of the non-volatile memory device, and the non-volatile memory device. More specifically, the present invention relates to a designing method of a cross-point non-volatile memory device including variable resistance elements and current steering (controlling) elements, a manufacturing method of the cross-point non-volatile memory device, and the cross-point non-volatile memory device.

BACKGROUND ART

In recent years, with progresses of digital technologies, electronic devices such as portable information devices and information home electric appliances have been developed to provide higher functionalities. With achievement of the higher functionalities of these electronic devices, non-volatile memory devices incorporated into the electronic devices have been developed to achieve a greater scale, higher-dense integration and a higher speed, and uses of the non-volatile memory devices have been expanding at a high pace.

Among the non-volatile memory devices, a memory device has been proposed, in which non-volatile variable resistance elements are used as memory elements and are arranged in matrix. It is expected that by forming a three-dimensional memory in which matrixes are stacked together, a greater scale, higher-dense integration and a higher speed of the memory device, are attained.

The variable resistance element has a thin layer made of a material comprising, for example, a metal oxide. By applying an electric pulse to this thin layer, its electric resistance value changes and the changed electric resistance value is preserved. By corresponding a high-resistance state and a low-resistance state of the thin layer with, for example, binary data "1" and "0", the binary data can be stored in the variable resistance element.

As the variable resistance element capable of storing the binary data, there are a variable resistance element (unipolar variable resistance element) which changes its resistance value by application of electric pulses of voltages which have the same polarity and are different in magnitude from each other, and a variable resistance element (bipolar variable resistance element) which changes its resistance value by application of electric pulses which are different in polarity from each other.

Typically, the unipolar variable resistance element has a characteristic in which write time taken to change the element from a low-resistance state to a high-resistance state (so-called reset) is longer than write time taken to change the element from the high-resistance state to the low-resistance state (so-called set). By comparison, in the bipolar variable resistance element, typically, write is enabled to occur in a short time in both of the set and the reset, and therefore a higher-speed operation is attained.

There is also known a memory device (cross-point memory device) in which a plurality of word lines cross (three-dimensionally cross) a plurality of bit lines, respectively, in a plan view such that the word lines and the bit lines do not contact each other, and variable resistance elements are placed at three-dimensional cross-points of the word lines and the bit lines, respectively. In the cross-point memory device, for example, when data is written to the variable resistance element, a leak current flowing through a cell other than a selected cell occurs. When the data written to the variable resistance element is read, a current flowing through the selected cell and the leak current flow as a bit line current to a bit line decoder, which determines a write state of the selected cell by a transistor within the decoder. If the leak current is great in magnitude even in a case where the current flowing through the bit line has an equal value, the current flowing through the selected cell is relatively small in magnitude, while if the leak current is small in magnitude even in a case where the current flowing through the bit line has an equal value, the current flowing through the selected cell is great in magnitude. In the former case, the current flowing through the selected cell is small in magnitude, which causes data to be written inadequately to the variable resistance element. To avoid this, it is necessary to lessen the leak current to ensure the current flowing through the selected cell. In addition, the leak current causes a failure (hereinafter this failure will be referred to as "write disturb") to occur, in which a resistance state of the variable resistance element in a cell other than the selected cell changes. It is therefore necessary to prevent the write disturb. For the above stated reasons, in the cross-point memory device, in some cases, a current steering (controlling) element is provided in each cell such that the current steering element is connected in series with the variable resistance element.

The unipolar variable resistance element is able to cause resistance change in response to the electric pulses with the same polarity. Therefore, in the cross-point memory device incorporating the unipolar variable resistance element, a unipolar (single-polarity) current steering element such as a p-n junction diode or a Schottky diode (element which has a non-linear [in which its resistance value is greater in a range (lower-voltage range) in which an absolute value of the voltage is smaller and its resistance value is smaller in a range (higher-voltage range) in which an absolute value of the voltage is greater] current characteristic with respect to one of positive and negative voltages and in which its resistance value is greater and which does not substantially flow a current with respect to the other voltage), is placed in series with the variable resistance element. Thus, occurrence of the write disturb can be prevented.

Patent Literature 1 discloses a memory cell in which a variable resistance element is connected in series with a Schottky diode. With this configuration, it becomes possible to lessen an influence caused by a read disturb in a memory cell including a series circuit of the variable resistance element and the diode.

By comparison, in the bipolar variable resistance element, two kinds of electric pulses which are different in polarity are used to write data to the variable resistance element. For this reason, a bidirectional current steering element (element which has a non-linear [in which its resistance value is greater in a range (lower-voltage range) in which an absolute value of the voltage is smaller and is smaller in a range (higher-voltage range) in which an absolute value of the voltage is greater] current characteristic with respect to both of positive and negative voltages) is placed in series with the variable resistance element. As the element having such a characteristic, there are known, for example, a MIM (Metal-Insulator-Metal) diode, a MSM (Metal-Semiconductor-Metal) diode, or a two-terminal element such as a varistor.

Patent Literature 2 discloses a memory element array composed of memory elements each of which is configured as a series circuit of a variable resistance element and a current steering element connected in series with the variable resistance element (paragraph 0129). The current steering element is configured to include a current steering layer and a pair of opposing electrodes between which the current steering layer is interposed. This configuration is the same as that of the MIM diode or the MSM diode (paragraph 0050).

CITATION LIST

Patent Literature

Patent Literature 1: Japanese Laid-Open Patent Application Publication No. 2004-319587
Patent Literature 2: International Publication No. 2010/032470

SUMMARY OF INVENTION

Technical Problem

In the above mentioned conventional configuration, it is not clear as to how the characteristic of the variable resistance element and the characteristic of the current steering element should be selected to control the leak current. Therefore, it is not easy to practically design the variable resistance memory device using the bipolar variable resistance element.

An object of the present invention is to practically design the variable resistance memory device with ease using the bipolar variable resistance element.

Solution to Problem

To solve the above mentioned problem, according to the present invention, there is provided a method of designing a cross-point non-volatile memory device including memory elements arranged in (N×M) matrix, each of the memory elements including a variable resistance element and a bidirectional current steering element connected in series with the variable resistance element, the variable resistance element being configured such that when a high-resistance state writing voltage is applied to the variable resistance element in a low-resistance state, the variable resistance element reversibly changes to a high-resistance state in which the variable resistance element has a greater resistance value than in the low-resistance state, while when a low-resistance state writing voltage different in polarity from the high-resistance state writing voltage is applied to the variable resistance element in the high-resistance state, the variable resistance element reversibly changes to the low-resistance state, the method comprising the step of: when an absolute value of the low-resistance state writing voltage is VR and an absolute value of a current flowing through the variable resistance element having changed to the low-resistance state by application of the low-resistance state writing voltage to both ends of the variable resistance element in the high-resistance state is $I_{on}$ ($\mu A$), and a relationship between a voltage $V_0$ applied to both ends of the bidirectional current steering element and a current I ($\mu A$) flowing through the bidirectional current steering element is approximated as $|V_0|=a \times Log(I)+b$, deciding N, M, VR, $I_{on}$, a, and b such that $b-VR/2>a \times [Log\{(N-1) \times (M-1)\}-Log(I_{on})]$ is satisfied.

A method of manufacturing a cross-point non-volatile memory device, of the present invention, comprises the steps of: designing the cross-point non-volatile memory device by the method of designing the cross-point non-volatile memory device as recited above; and manufacturing the cross-point non-volatile memory device based on the design; wherein the cross-point non-volatile memory device includes: memory elements arranged in (N×M) matrix, each of the memory elements including a variable resistance element and a bidirectional current steering element connected in series with the variable resistance element, wherein when the absolute value of the low-resistance state writing voltage is VR and the absolute value of the current flowing through the variable resistance element having changed to the low-resistance state by application of the low-resistance state writing voltage to both ends of the variable resistance element in the high-resistance state is $I_{on}$, and a relationship between the voltage $V_0$ applied to both ends of the bidirectional current steering element and the current I flowing through the bidirectional current steering element is approximated as $|V_0|=a \times Log(I)+b$, in a range of $I_{on} \times 10^{-3} \leq I \leq I_{on}$, $b-VR/2>a \times [Log\{(N-1) \times (M-1)\}-Log(I_{on})]$ is satisfied.

A cross-point non-volatile memory device of the present invention comprises memory elements arranged in (N×M) matrix; each of the memory elements including a variable resistance element and a bidirectional current steering element connected in series with the variable resistance element; the variable resistance element being configured such that when a high-resistance state writing voltage is applied to the variable resistance element in a low-resistance state, the variable resistance element reversibly changes to a high-resistance state in which the variable resistance element has a greater resistance value than in the low-resistance state, while when a low-resistance state writing voltage different in polarity from the high-resistance state writing voltage is applied to the variable resistance element in the high-resistance state, the variable resistance element reversibly changes to the low-resistance state; wherein when an absolute value of the low-resistance state writing voltage is VR and an absolute value of a current flowing through the variable resistance element having changed to the low-resistance state by application of the low-resistance state writing voltage to both ends of the variable resistance element in the high-resistance state is $I_{on}$, and a relationship between a voltage $V_0$ applied to both ends of the bidirectional current steering element and a current I flowing through the bidirectional current steering element is approximated as $|V_0|=a \times Log(I)+b$, $b-VR/2>a \times [Log\{(N-1) \times (M-1)\}-Log(I_{on})]$ is satisfied.

Advantageous Effects of Invention

A designing method of a non-volatile memory device, a manufacturing method of the non-volatile memory device, and the non-volatile memory device allow a variable resistance memory device to be practically designed with ease using a bipolar variable resistance element.

DESCRIPTION OF EMBODIMENTS

Hereinafter, new findings obtained through the present inventors' experiments and the like will be described, prior to describing the detail of the present invention. Hereinafter, the findings will be described with reference to FIGS. 17 to 20. This is intended to allow for easier understanding of the embodiments of the present invention as will be described later. The scope of the present invention is not limited to these drawings and description thereof.

(Findings as a Base for the Invention)

The present inventors intensively studied a method of practically designing a variable resistance memory device using a bipolar variable resistance element, and obtained the following findings.

Figure 17A:
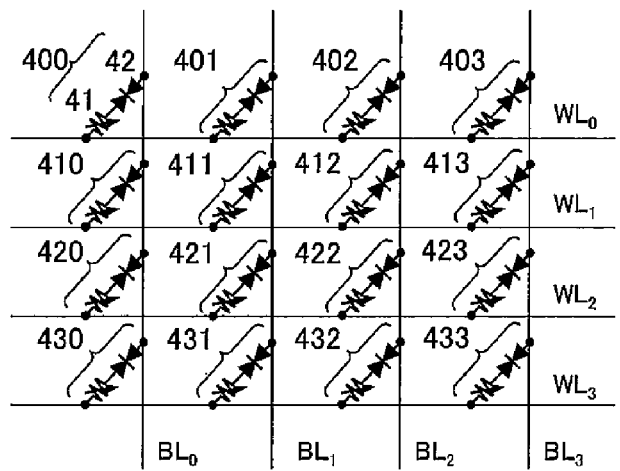
FIG. 17A is a circuit diagram of a cross-point non-volatile memory device including four word lines and four bit lines.
Figure 17B:
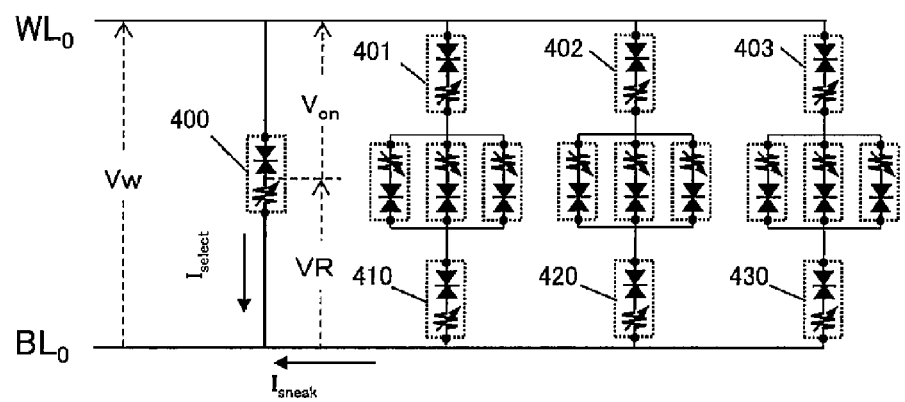
FIG. 17B is an equivalent circuit diagram of FIG. 17A.

FIG. 17A is a circuit diagram of a cross-point non-volatile memory device 20 including four word lines and four bit lines. FIG. 17B is a view showing an equivalent circuit of FIG. 17A. Hereinafter, a relationship between a voltage and a current during write in the non-volatile memory device 20 will be studied. Now, consideration will be given of a case where the write is performed under a situation in which the write is most likely to be affected by a leak current, i.e., specifically, a variable resistance element of a selected memory element (memory cell) is in a high-resistance state, all of variable resistance elements of memory elements other than the selected memory element are in a low-resistance state, and the variable resistance element of the selected memory element is changed to the low-resistance state.

A case where a memory element 400 is selected in the circuit diagram of FIG. 17A will be described. In this case, a voltage Vw (herein assumed as Vw>0) is applied between a word line $WL_0$ and a bit line $BL_0$, to change the resistance value of the memory element 400, thus writing information. A low-resistance state writing voltage (absolute value=VR) required to change the variable resistance element 41 from the high-resistance state to the low-resistance state is applied to both ends of the variable resistance element 41 (bipolar variable resistance element) of the selected memory element (hereinafter selected memory element). An ON-voltage (absolute value=$V_{on}$) for supplying a current required for the resistance change is applied to both ends of a bidirectional current steering element 42 of the selected memory element 400. Therefore, the voltage Vw applied between the word line $WL_0$ and the bit line $BL_0$ is equal to a sum of the absolute value VR of the low-resistance state writing voltage and the ON-voltage $V_{on}$ applied to the bidirectional current steering element 42.

FIG. 17B is an equivalent circuit diagram of the cross-point non-volatile memory device. In the non-volatile memory device 20, all of the memory elements are connected to each other via the word lines WL, the bit lines BL and the memory elements. Because of this, plural paths including memory elements which are not selected (unselected memory elements) are connected in parallel with the selected memory element 400. There are numerous paths. A current flowing through a path including five or more unselected memory elements is negligible as compared to a current flowing through a path including three unselected memory elements. Therefore, in FIG. 17B and description below, the path including five or more unselected memory elements will be omitted.

When the voltage Vw is applied between the word line $WL_0$ and the bit line $BL_0$, it is also applied to the paths including unselected memory elements, causing a leak current $I_{sneak}$ (total of currents flowing through paths including the unselected memory elements) to be generated.

In the equivalent circuit diagram of FIG. 17B, there are nine paths including the unselected memory elements, which are [1] path from the word line $WL_0$ to the bit line $BL_0$ by way of a memory element 401, a bit line $BL_1$, a memory element 411, a word line $WL_1$, and a memory element 410, [2] path from the word line $WL_0$ to the bit line $BL_0$ by way of the memory element 401, the bit line $BL_1$, a memory element 421, a word line $WL_2$, and a memory element 420, [3] path from the word line $WL_0$ to the bit line $BL_0$ by way of the memory element 401, the bit line $BL_1$, a memory element 431, a word line $WL_3$, and a memory element 430, [4] path from the word line $WL_0$ to the bit line $BL_0$ by way of a memory element 402, a bit line $BL_2$, a memory element 412, the word line $WL_1$, and the memory element 410, . . . [9] path from the word line $WL_0$ to the bit line $BL_0$ by way of a memory element 403, a bit line $BL_3$, a memory element 433, a word line $WL_3$, and the memory element 430.

From a different perspective, each of the paths has a one-to-one correspondence with a second memory element included in three memory elements on the path. The second memory element connects the word lines ((4−1) word lines in FIG. 17B) other than the selected word line to the bit lines ((4−1) word lines in FIG. 17B) other than the selected bit line. Therefore, the number of paths in (4×4) matrix is (4−1)×(4−1)=9.

As can be evident from the above study, the number of paths including the unselected memory elements increases as the matrix increases in size. With an increase in the number of paths, the leak current $I_{sneak}$ increases correspondingly. That is, with an increase in the storage capacity, the leak current $I_{sneak}$ increases.

Figure 18:
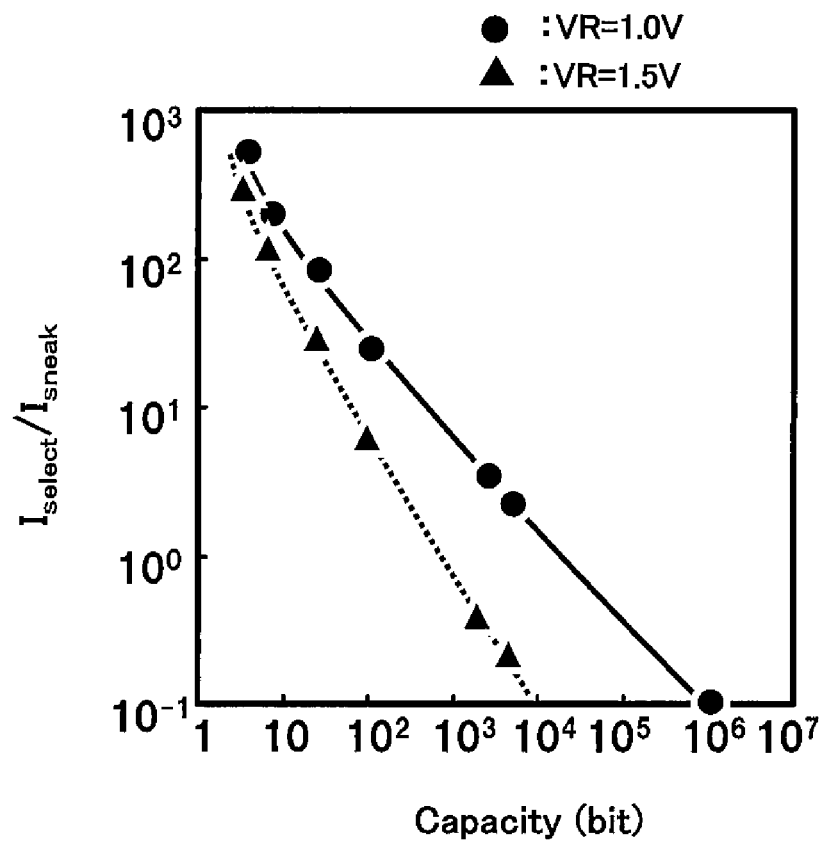
FIG. 18 is a graph showing plots of a ratio of a current required to change a resistance state of a selected memory element with respect to a current flowing through unselected memory elements, for respective storage capacities, in a cross-point non-volatile memory device incorporating a bipolar variable resistance element.

FIG. 18 is a graph showing plots of a ratio of a current (write current, select current $I_{select}$) required to change a resistance state of the selected memory element with respect to a current (leak current) flowing through unselected memory elements, for respective storage capacities, in a cross-point non-volatile memory device incorporating a bipolar variable resistance element. The "current (write current) required to change the resistance state of the selected memory element" refers to a current flowing through the variable resistance element in a state in which the low-resistance state writing voltage continues to be applied to the variable resistance element in the low-resistance state after the low-resistance state writing voltage has been applied to the variable resistance element in the high-resistance state and the variable resistance element has changed from the high-resistance state to the low-resistance state. Calculation conditions are such that the resistance value of the variable resistance element in the low-resistance state is 10 kΩ, the voltage applied to the memory element to change the variable resistance element to the low-resistance state is 2.5V, the voltage generated between both ends of the variable resistance element just before the variable resistance element in the high-resistance state changes to the low-resistance state is 1.0V, the resistance value of the bidirectional current steering element at a voltage of 1.0V is 1 MΩ, the resistance value of the bidirectional current steering element at a voltage of 2.0V is 20 kΩ, etc., and all of the unselected memory elements are in the low-resistance state. As can be seen from the graph, the leak current increases as the storage capacity increases. Therefore, the ratio of the write current applied to the selected memory element to the leak current decreases as the storage capacity increases.

In a case where the write voltage VR applied to the variable resistance element constituting the memory element is high, the voltage (sum of VR and $V_{on}$) applied to the selected memory element increases. Because of this, the voltage applied to the unselected memory element increases, and the leak current increases. Therefore, the ratio ($I_{select}/I_{sneak}$) of the write current of the selected memory element to the leak current decreases as the write voltage increases.

In the cross-point non-volatile memory device, a current steering element having a characteristic (current supply capability and current cut-off capability) capable of supplying the write current $I_{select}$ to the selected memory element and appropriately reducing the leak current $I_{sneak}$ flowing through the unselected memory element, may be used. The write current $I_{select}$ varies depending on the characteristic of the variable resistance element, while the leak current $I_{sneak}$ varies depending on the storage capacity. Therefore, the characteristic required for the current steering element varies depending on the characteristic of the variable resistance element and the storage capacity.

In the conventional cross-point non-volatile memory device, regarding the variable resistance element and the current steering element included in the memory element, their characteristics were proposed separately. For this reason, the characteristic required for the current steering element cannot be selected appropriately, and as a result, it was difficult to practically design a variable resistance memory device so that the leak current can be reduced appropriately.

The present inventors succeeded in formulating a condition to be satisfied by the storage capacity, the characteristic of the variable resistance element and the characteristic of the bidirectional current steering element by approximating the characteristic of the bidirectional current steering element using a specified formula. As a result, it became possible to practically design the variable resistance memory device with ease so that the leak current can be reduced appropriately, using the bipolar variable resistance element. This will be described in detail.

When a voltage applied to both ends of the bidirectional current steering element is expressed as $V_0(V)$ and a current flowing therethrough is expressed as $I(\mu A)$, it was discovered that a current-voltage characteristic of a MSM current steering element including a current steering layer comprising, for example, $SiN_x$, can be approximated as "$V_0 = a \times Log(I) + b$" in a range from a current value (about $10^{-7}$ [A]) which is three-digit smaller than the write current of the variable resistance element, to the write current. Log indicates a common logarithm (logarithm with base of 10). It should be noted that a current-voltage characteristic of a MIM current steering element including a current steering layer comprising an oxide of Ti, V, Zn, etc., can also be approximated as "$V_0 = a \times Log(I) + b$".

Typically, the current value which is three-digit smaller than the write current corresponds to a cut-off current (OFF-current) of the current steering element of the non-volatile memory device. Therefore, the above mentioned approximation formula includes an ON-characteristic (current-voltage characteristic of a value of a current required to be flowed through the variable resistance element to change the variable resistance element in the high-resistance state to the low-resistance state, or a value of a current required to be flowed through the variable resistance element to change the variable resistance element in the low-resistance state to the high-resistance state), and an OFF-characteristic (current-voltage characteristic of a value of a current allowed to be flowed through the unselected memory element).

EXPERIMENTAL EXAMPLE 1

In Experimental example 1, created was an example (nitrogen content ratio x=0.3, thickness d=13 nm, electrode material=tantalum nitride, size of electrode=0.38 μm×0.38 μm) of the MSM current steering element including the current steering layer comprising $SiN_x$ (0<x≤0.85: x is a ratio of the number of nitrogen atoms to the number of Si atoms, the same occurs hereinafter), and its current-voltage characteristic was studied.

Figure 19A:
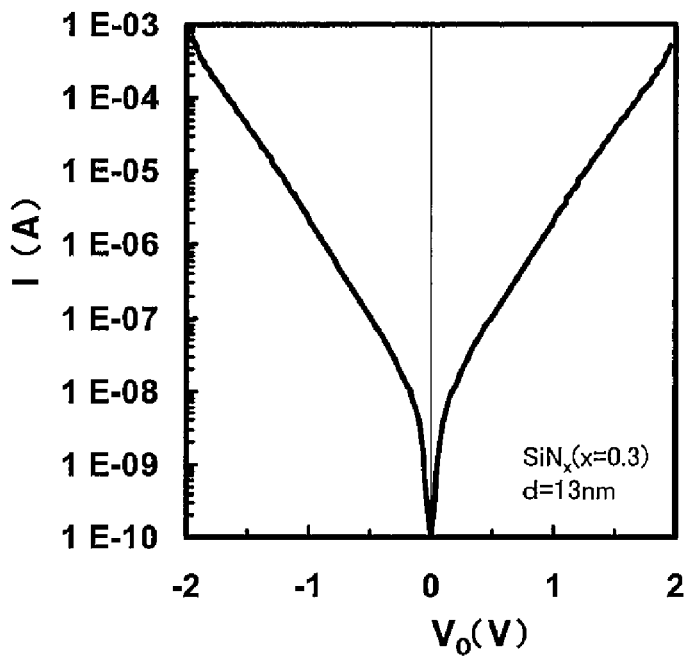
FIG. 19A is a view showing a current-voltage characteristic of a MSM current steering element in Experimental example 1.
Figure 19B:
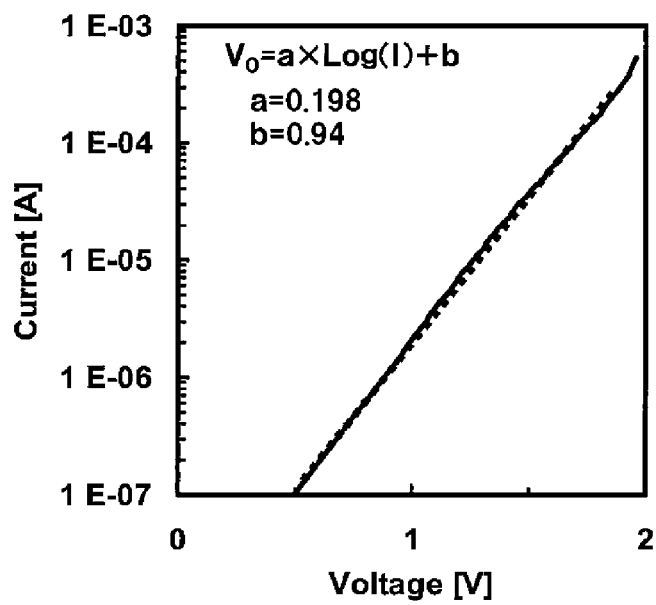
FIG. 19B is an enlarged view showing a current range of $10^{-7}$ [A] to $10^{-3}$ [A] in the current-voltage characteristic of FIG. 19A.

FIG. 19A is a view showing the current-voltage characteristic of the MSM current steering element in Experimental example 1. FIG. 19B is an enlarged view showing a current range of $10^{-7}$ [A] to $10^{-3}$ [A] in the current-voltage characteristic of FIG. 19A.

As can be seen from FIG. 19B, the current-voltage characteristic of the MSM current steering element including the current steering layer comprising $SiN_x$ could be approximated as a straight line "$V_0 = a \times Log(I) + b$" in the above stated current range. The coefficient a was 0.198 and the coefficient b was 0.94. A parameter $R^2$ representing a consistency between a measurement result and the approximation formula was equal to or greater than 0.99.

EXPERIMENTAL EXAMPLE 2

In Experimental example 2, created were MSM current steering elements (nitrogen content ratio x=0.3 to 0.6, thickness d=13 nm, electrode material=tantalum nitride, size of electrode=0.38 μm×0.38 μm) including the current steering layers comprising $SiN_x$ layers which were different in nitrogen content ratio x, and their current-voltage characteristics were studied.

Figure 20A:
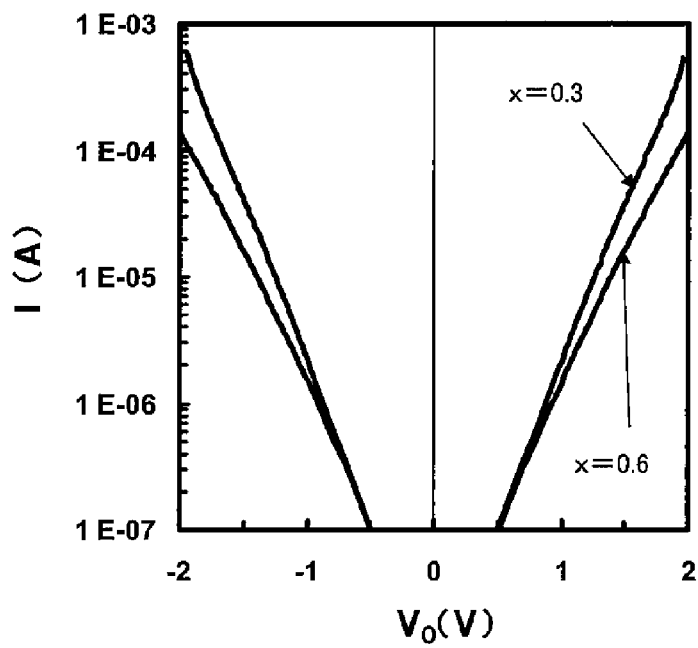
FIG. 20A is a view showing current-voltage characteristics of MSM current steering elements in Experimental example 2.

FIG. 20A is a view showing the current-voltage characteristics of the MSM current steering elements in Experimental example 2. As can be seen from FIG. 20A, as the value of x increases, a slope of the graph of the current-voltage characteristic in FIG. 20A decreases. The slope of the graph corresponds to a in the above formula "$V_0 = a \times Log(I) + b$".

EXPERIMENTAL EXAMPLE 3

In Experimental example 3, created were MSM current steering elements (nitrogen content ratio x=0.6, thickness d=6 to 12 nm, electrode material=tantalum nitride, size of electrode=0.38 μm×0.38 μm) including the current steering layers comprising $SiN_x$ layers which were different in thickness d, and their current-voltage characteristics were studied.

Figure 20B:
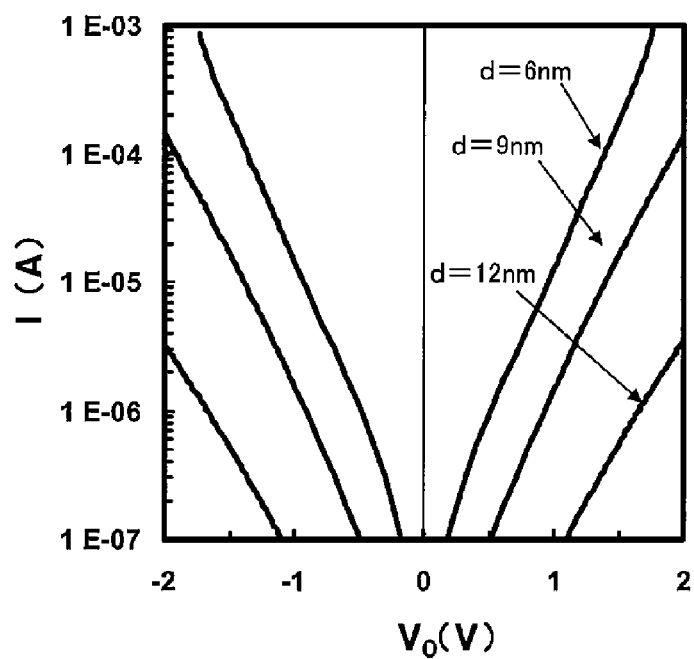
FIG. 20B is a view showing current-voltage characteristics of MSM current steering elements in Experimental example 3.

FIG. 20B is a view showing the current-voltage characteristics of the MSM current steering elements in Experimental example 3. As can be seen from FIG. 20B, as the value of d increases, V-intercept of the current-voltage characteristic in FIG. 20B increases. The V-intercept of the graph corresponds to b in the above formula "$V_0 = a \times Log(I) + b$".

[Study]

From the results of Experimental example 1 to Experimental example 3, it was found out that the current-voltage characteristics of the MSM current steering elements including the current steering layers comprising $SiN_x$ can be approximated as "$V_0 = a \times Log(I) + b$", irrespective of differences in the nitrogen content ratio x and the thickness d. It was also revealed that the current-voltage characteristic of the current steering element, i.e., the coefficient a and the coefficient b are made variable as desired, by controlling the nitrogen content ratio x and the thickness d.

If the current-voltage characteristic of the bidirectional current steering element can also be approximated as the straight line "$V_0 = a \times Log(I) + b$", in the above stated current range, even in a case where a material other than $SiN_x$ is used as the current steering layer, the coefficient a and the coefficient b can be controlled by this method. The phrase "current-voltage characteristic can be approximated" may mean that the parameter $R^2$ representing the consistency between the measurement result and the approximation formula may be equal to or greater than 0.90, for example.

By utilizing the above described new findings, it became possible to practically design the variable resistance memory device with ease so that the leak current can be reduced appropriately, using the bipolar variable resistance element.

Embodiment 1

According to a first aspect of Embodiment 1, there is provided a method of designing a cross-point non-volatile memory device including memory elements arranged in (N×M) matrix, each of the memory elements including a variable resistance element and a bidirectional current steering element connected in series with the variable resistance element, the variable resistance element being configured such that when a high-resistance state writing voltage is applied to the variable resistance element in a low-resistance state, the variable resistance element reversibly changes to a high-resistance state in which the variable resistance element has a greater resistance value than in the low-resistance state, while when a low-resistance state writing voltage different in polarity from the high-resistance state writing voltage is applied to the variable resistance element in the high-resistance state, the variable resistance element reversibly changes to the low-resistance state, the method comprising the step of: when an absolute value of the low-resistance state writing voltage is VR and an absolute value of a current flowing through the variable resistance element having changed to the low-resistance state by application of the low-resistance state writing voltage to both ends of the variable resistance element in the high-resistance state is $I_{on}$, and a relationship between a voltage $V_0$ applied to both ends of the bidirectional current steering element and a current I flowing through the bidirectional current steering element is approximated as $|V_0|=a\times Log(I)+b$, deciding N, M, VR, $I_{on}$, a, and b such that $b-VR/2>a\times[Log\{(N-1)\times(M-1)\}-Log(I_{on})]$ is satisfied.

A method of designing a non-volatile memory device according to a second aspect of Embodiment 1, in the method of designing the non-volatile memory device according to the first aspect of Embodiment 1, further comprises the steps of: deciding N and M based on a target value of a storage capacity of the non-volatile memory device; deciding VR, $I_{on}$, and $I_{off}$ based on a characteristic of the variable resistance element; and deciding a and b such that $b-VR/2>a\times[Log\{(N-1)\times(M-1)\}-Log(I_{on})]$ is satisfied, based on the decided N, M, VR, and $I_{on}$, after deciding N and M and deciding VR, $I_{on}$, and $I_{off}$.

In a method of designing a non-volatile memory device according to a third aspect of Embodiment 1, in the method of designing the non-volatile memory device according to the first or second aspect of Embodiment 1, N, M, VR, $I_{on}$, a, and b are decided under a condition in which a>0.106.

The bidirectional current steering element is required to supply a write current to the variable resistance element. Therefore, a Schottky junction which allows major carriers to flow therethrough, may be formed at an interface between the electrode and the current steering layer of the current steering element. When a characteristic of the bidirectional current steering element having an ideal Schottky junction interface is expressed as $V_0=a\times Log(I)+b$, the coefficient a is 0.106. By setting a to, for example, 0.106 or greater, the Schottky junction which allows major carriers to flow therethrough, can be formed at the interface between the electrode and the current steering layer.

In a method of designing a non-volatile memory device according to a fourth aspect of Embodiment 1, in the method of designing the non-volatile memory device according to any one of the first to third aspects of Embodiment 1, N, M, VR, $I_{on}$, a, and b are decided under a condition in which b>0.

The coefficient b is intercept of the current-voltage characteristic approximated as $V_0=a\times Log(I)+b$. When the coefficient b is greater than zero, it is possible to obtain a current-voltage characteristic which is roughly symmetric with respect to voltages which are different in polarity, and hence, stability of a write operation of a bipolar variable resistance element is improved.

In a method of designing a non-volatile memory device according to a fifth aspect of Embodiment 1, in the method of designing the non-volatile memory device according to any one of the first to fourth aspects of Embodiment 1, the bidirectional current steering element includes a first electrode, a second electrode, and a current steering layer interposed between the first electrode and the second electrode, and the current steering layer comprises $SiN_x$ (0<x≤0.85).

In such a configuration, by adjusting a nitrogen content ratio x and a thickness d of the current steering layer $SiN_x$, the current-voltage characteristic of the MSM current steering element can be easily controlled. Therefore, it becomes possible to obtain a characteristic of the current steering element required for the non-volatile memory device.

According to a six aspect of Embodiment 1, there is provided a method of manufacturing a cross-point non-volatile memory device, comprising the steps of: designing the cross-point non-volatile memory device by the method of designing the cross-point non-volatile memory device as recited in any one of the first to fifth aspects of Embodiment 1; and manufacturing the cross-point non-volatile memory device based on the design; wherein the cross-point non-volatile memory device includes: memory elements arranged in (N×M) matrix, each of the memory elements including a variable resistance element and a bidirectional current steering element connected in series with the variable resistance element, wherein when the absolute value of the low-resistance state writing voltage is VR and the absolute value of the current flowing through the variable resistance element having changed to the low-resistance state by application of the low-resistance state writing voltage to both ends of the variable resistance element in the high-resistance state is $I_{on}$, and a relationship between the voltage $V_0$ applied to both ends of the bidirectional current steering element and the current I flowing through the bidirectional current steering element is approximated as $|V_0|=a\times Log(I)+b$, in a range of $I_{on}\times 10^{-3}\leq I\leq I_{on}$, $b-VR/2>a\times[Log\{(N-1)\times(M-1)\}-Log(I_{on})]$ is satisfied.

According to a seventh aspect of Embodiment 1, there is provided a cross-point non-volatile memory device comprising: memory elements arranged in (N×M) matrix; each of the memory elements including a variable resistance element and a bidirectional current steering element connected in series with the variable resistance element; the variable resistance element being configured such that when a high-resistance state writing voltage is applied to the variable resistance element in a low-resistance state, the variable resistance element reversibly changes to a high-resistance state in which the variable resistance element has a greater resistance value than in the low-resistance state, while when a low-resistance state writing voltage different in polarity from the high-resistance state writing voltage is applied to the variable resistance element in the high-resistance state, the variable resistance element reversibly changes to the low-resistance state; wherein when an absolute value of the low-resistance state writing voltage is VR and an absolute value of a current flowing through the variable resistance element having changed to the low-resistance state by application of the low-resistance state writing voltage to both ends of the variable resistance element in the high-resistance state is $I_{on}$, and a relationship between a voltage $V_0$ applied to both ends of the bidirectional current steering element and a current I flowing through the bidirectional current steering element is approximated as $|V_0|=a\times Log(I)+b$, $b-VR/2>a\times[Log\{(N-1)\times(M-1)\}-Log(I_{on})]$ is satisfied.

In a non-volatile memory device according to an eighth aspect of Embodiment 1, in the non-volatile memory device according to the seventh aspect of Embodiment 1, a>0.106.

The bidirectional current steering element is required to supply a write current to the variable resistance element. Therefore, a Schottky junction which allows major carriers to flow therethrough, may be formed at an interface between the electrode and the current steering layer of the current steering element. When a characteristic of the bidirectional current steering element having an ideal Schottky junction interface is expressed as $V_0=a\times Log(I)+b$, the coefficient a is 0.106. By setting a to, for example, 0.106 or greater, the Schottky junction which allows major carriers to flow therethrough, can be formed at the interface between the electrode and the current steering layer.

In a non-volatile memory device according to a ninth aspect of Embodiment 1, in the non-volatile memory device according to the seventh or eighth aspect of Embodiment 1, b>0.

The coefficient b is intercept of the current-voltage characteristic approximated as $V_0=a\times Log(I)+b$. When the coefficient b is greater than zero, it is possible to obtain a current-voltage characteristic which is roughly symmetric with respect to voltages which are different in polarity, and hence, stability of a write operation of a bipolar variable resistance element is improved.

In a non-volatile memory device according to a tenth aspect of Embodiment 1, in the non-volatile memory device according to any one of the seventh to ninth aspects of Embodiment 1, the bidirectional current steering element includes a first electrode, a second electrode, and a current steering layer interposed between the first electrode and the second electrode, and the current steering layer comprises $SiN_x$ (0<x≤0.85).

In such a configuration, by adjusting the nitrogen content ratio x and the thickness d of $SiN_x$ of the current steering layer, the current-voltage characteristic of the bidirectional current steering element can be easily controlled. Therefore, it becomes possible to obtain a characteristic of the current steering element required for the non-volatile memory device.

[Designing Method and Manufacturing Method]

Figure 1:
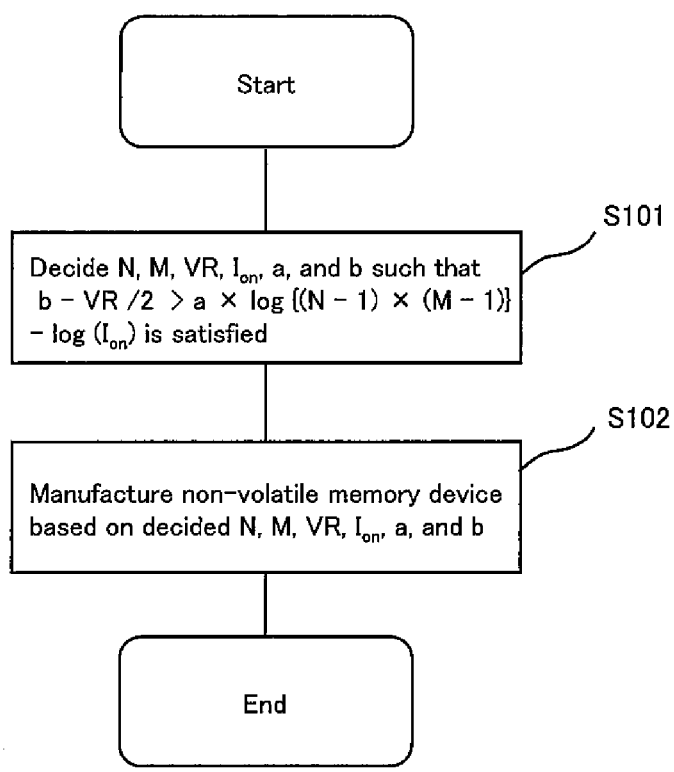
FIG. 1 is a schematic view showing an exemplary designing method and an exemplary manufacturing method of a non-volatile memory device according to Embodiment 1.

FIG. 1 is a schematic view showing an exemplary designing method and an exemplary manufacturing method of a non-volatile memory device according to Embodiment 1.

A designing method and a manufacturing method of a non-volatile memory device of Embodiment 1 are a designing method and a manufacturing method of a cross-point non-volatile memory device including memory elements arranged in (N×M) matrix, each of the memory elements including a variable resistance element and a bidirectional current steering (controlling) element connected in series with the variable resistance element.

In Embodiment 1, the variable resistance element is configured such that when a high-resistance state writing voltage is applied to the variable resistance element in a low-resistance state, the variable resistance element reversibly changes to a high-resistance state in which the variable resistance element has a greater resistance value than in the low-resistance state, while when a low-resistance state writing voltage different in polarity from the high-resistance state writing voltage is applied to the variable resistance element in the high-resistance state, the variable resistance element reversibly changes to the low-resistance state.

As shown in FIG. 1, a manufacturing method of a non-volatile memory device of the present embodiment, comprises the steps of: when an absolute value of the low-resistance state writing voltage is VR and an absolute value of a current flowing through the variable resistance element having changed to the low-resistance state by application of the low-resistance state writing voltage to both ends of the variable resistance element in the high-resistance state is $I_{on}$, and a relationship between a voltage $V_0$ applied to both ends of the bidirectional current steering element and a current I flowing through the bidirectional current steering element is approximated as $|V_0|=a\times Log(I)+b$, deciding N, M, VR, $I_{on}$, a, and b such that $b-VR/2>a\times Log\{(N-1)\times(M-1)\}-Log(I_{on})$ is satisfied (step S101); and manufacturing the non-volatile memory device based on N, M, VR, $I_{on}$, a, and b decided in step S101 (step S102).

A designing method of a non-volatile memory device of the present embodiment, comprises the steps of: when an absolute value of the low-resistance state writing voltage is VR and an absolute value of a current flowing through the variable resistance element having changed to the low-resistance state by application of the low-resistance state writing voltage to both ends of the variable resistance element in the high-resistance state is $I_{on}$, and a relationship between a voltage $V_0$ applied to both ends of the bidirectional current steering element and a current I flowing through the bidirectional current steering element is approximated as $|V_0|=a\times Log(I)+b$, deciding N, M, VR, $I_{on}$, a, and b such that $b-VR/2>a\times Log\{(N-1)\times(M-1)\}-Log(I_{on})$ is satisfied (step S101)

[Device Configuration]

Figure 2:
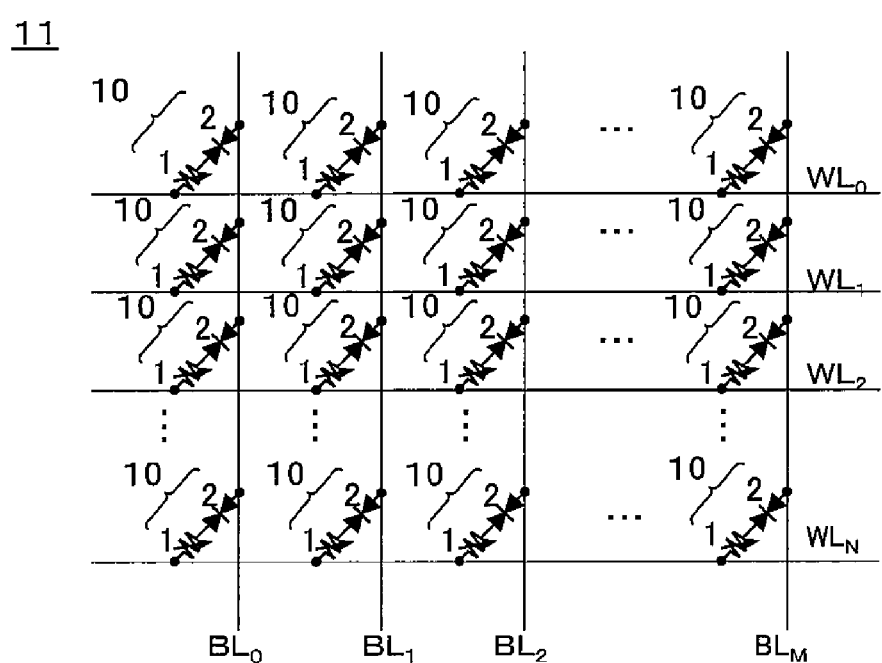
FIG. 2 is a circuit diagram showing an exemplary schematic configuration of a cross-point non-volatile memory device according to Embodiment 1.

FIG. 2 is a circuit diagram showing an exemplary schematic configuration of the cross-point non-volatile memory device according to Embodiment 1.

As shown in FIG. 2, a non-volatile memory device 11 of the present embodiment includes memory elements 10 arranged in (N×M) matrix, and each of the memory elements 10 includes a variable resistance element 1 and a bidirectional current steering element 2 connected in series with the variable resistance element 1.

The variable resistance element 1 is configured such that, by application of a high-resistance state writing voltage to the variable resistance element 1 in a low-resistance state, it reversibly changes to a high-resistance state in which the variable resistance element 1 has a greater resistance value than in the low-resistance state, while when a low-resistance state writing voltage different in polarity from the high-resistance state writing voltage is applied to the variable resistance element in the high-resistance state, it reversibly changes to the low-resistance state.

Figure 3:
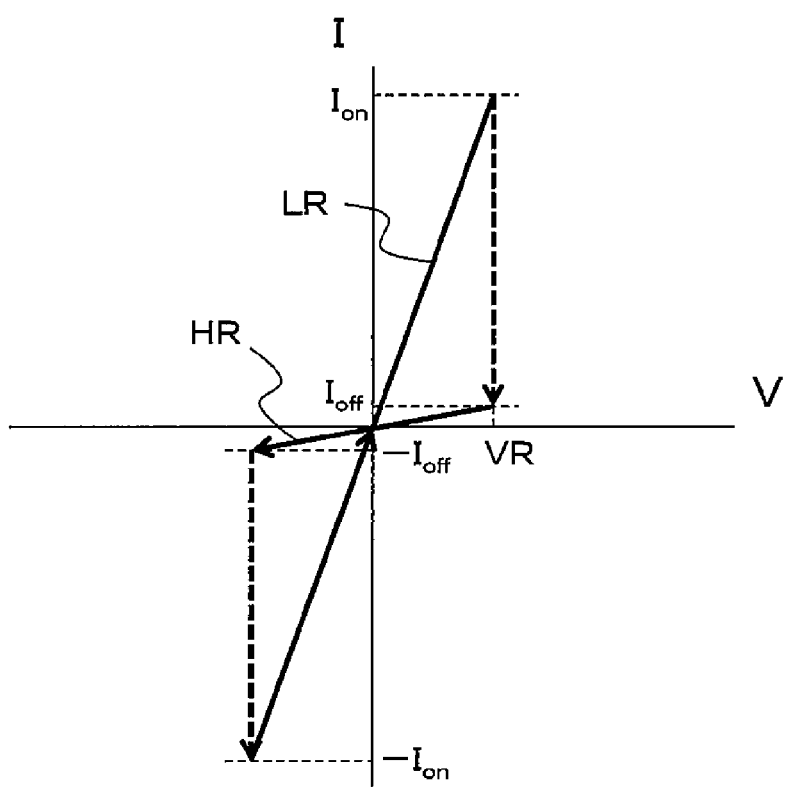
FIG. 3 is a conceptual view showing an exemplary current-voltage characteristic of a variable resistance element of the present embodiment.

FIG. 3 is a conceptual view showing an exemplary current-voltage characteristic of the variable resistance element of the present embodiment.

As shown in FIG. 3, by application of the low-resistance state writing voltage (e.g., negative voltage having an absolute value VR) to the variable resistance element 1 in the high-resistance state (HR), the variable resistance element 1 changes to the low-resistance state (LR). At this time, a current $I_{on}$ flows through the variable resistance element 1. A magnitude of the current $I_{on}$ may be decided by, for example, a current steering element such as a transistor provided outside of the memory array of FIG. 2. That is, the resistance value corresponding to the low-resistance state and the magnitude of the current $I_{on}$ may be decided depending on a level (magnitude of a current compliance limit) of the current compliance limit set when the variable resistance element 1 changes to the low-resistance state. By applying the high-resistance state writing voltage (e.g., positive voltage having an absolute value VR) to the variable resistance element 1 in the low-resistance state (LR), the variable resistance element 1 changes to the high-resistance state (HR).

When an absolute value of the low-resistance state writing voltage is VR and an absolute value of the current flowing through the variable resistance element 1 by application of the low-resistance state writing voltage VR to both ends of the variable resistance element 1 in the high-resistance state is $I_{on}$, a relationship between the voltage $V_0$ applied to both ends of the bidirectional current steering element 2 and the current I flowing through the bidirectional current steering element 2 can be approximated as the following formula (1):

$$|V_0|=a\times Log(I)+b \tag{1}$$

Figure 4:
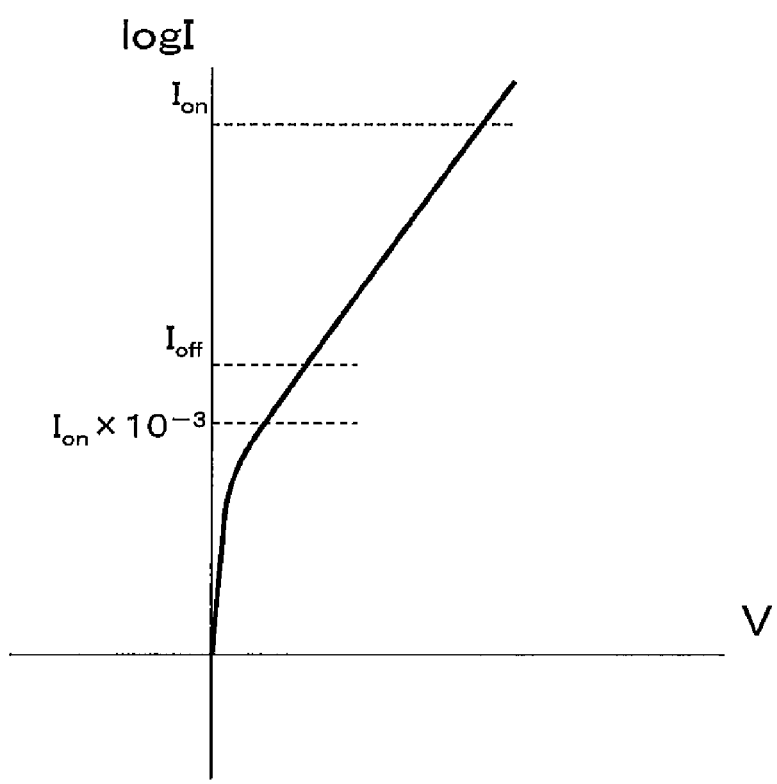
FIG. 4 is a conceptual view showing an exemplary current-voltage characteristic of a bidirectional current steering element of the present embodiment, which current-voltage characteristic is at a positive voltage side.

FIG. 4 is a conceptual view showing an exemplary current-voltage characteristic of the bidirectional current steering element of the present embodiment, which current-voltage characteristic is at a positive voltage side.

As shown in FIG. 4, the current-voltage characteristic of the bidirectional current steering element 2 of the present embodiment is linear (straight-line) in a range in which the current is equal to or greater than $I_{on} \times 10^{-3}$ and equal to or less than $I_{on}$. Therefore, the current-voltage characteristic of the bidirectional current steering element 2 can be approximated as $|V_0|=a \times \text{Log}(I)+b$.

Furthermore, in the non-volatile memory device of the present embodiment, the following formula (2) is satisfied:

$$b-VR/2 > a \times \text{Log}\{(N-1) \times (M-1)\} \times \text{Log}(I_{on}) \quad (2)$$

Hereinafter, how to derive the formula (2) will be described.

Figure 5:
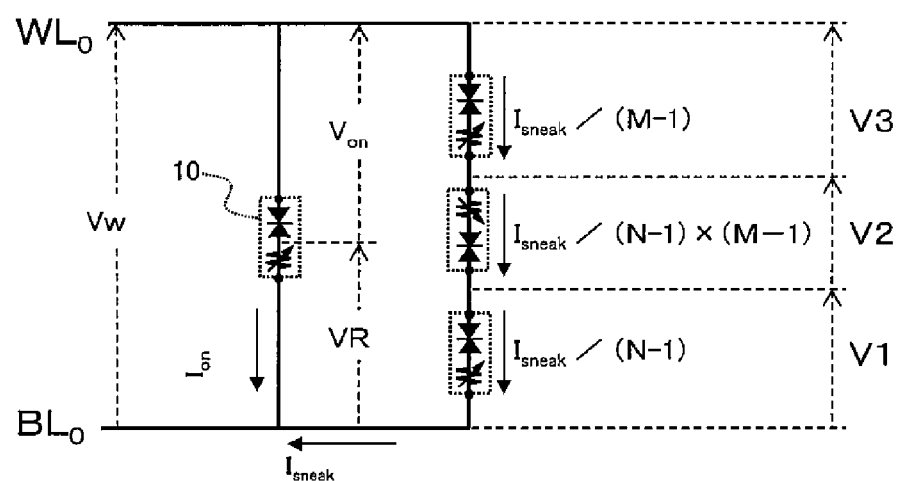
FIG. 5 is a schematic view of an equivalent circuit showing an exemplary schematic configuration of the cross-point non-volatile memory device according to Embodiment 1.

FIG. 5 is a schematic view of an equivalent circuit showing an exemplary schematic configuration of the cross-point non-volatile memory device according to Embodiment 1. FIG. 5 is a schematic view of the equivalent circuit of FIG. 2.

It is supposed that in the example of FIG. 2, the memory element 10 disposed at a three-dimensional cross-point of the word line $WL_0$ and the bit line $BL_0$ is selected.

As shown in FIG. 5, by applying the voltage Vw between the word line $WL_0$ and the bit line $BL_0$, the memory element 10 (hereinafter referred to as selected memory element) disposed at the three-dimensional cross-point of the word line $WL_0$ and the bit line $BL_0$ is selected, and the resistance value of the variable resistance element 1 of the selected memory element changes, thus writing information. At this time, it is necessary to flow through the selected memory element, a current required for a write operation (in the present embodiment, change from the high-resistance state to the low-resistance state) of the variable resistance element 1.

However, in addition to the path corresponding to the selected memory element, there are paths connecting the word line $WL_0$ and the bit line $BL_0$ to each other via the memory elements 10 (hereinafter will be referred to as unselected memory elements) which are not selected. When attention is paid to only the paths each including the three unselected memory elements, among the paths including the unselected memory elements as described above, the unselected memory elements are classified into three unselected memory element groups depending on positions relative to the selected memory element.

A first unselected memory element group is composed of (N−1) unselected memory elements connected in parallel with the bit line $BL_0$ to which the selected memory element is connected. A second unselected memory element group is composed of (N−1)×(M−1) unselected memory elements connected in parallel with the word lines WL to which the memory elements belonging to the first unselected memory element group are connected. A third unselected memory element group is composed of (M−1) unselected memory elements connected in parallel with the word line $WL_0$ to which the selected memory element is connected.

(N−1)×(M−1) paths each including the three unselected memory elements are connected in parallel with the selected word line $WL_0$ and the selected bit line $BL_0$. The voltage Vw is applied to each of these paths. For this reason, in the non-volatile memory device, a leak current flows via the unselected memory elements.

Now, it is supposed that the variable resistance elements of all of the memory elements are placed in the low-resistance state. Since voltage components corresponding to the variable resistance elements in the low-resistance state are negligible, a substantially entire portion of the voltage applied to each of the unselected memory elements is applied to both ends of the corresponding bidirectional current steering element.

The current-voltage characteristic of the bidirectional current steering element can be approximated in a range from a current value (about $10^{-7}$ [A]) which is three-digit smaller than the write current of the variable resistance element of the nonvolatile memory device, to the write current, as follows:

$$|V_0|=a \times \text{Log}(I)+b \quad (1)$$

Therefore, the current-voltage characteristic of the bidirectional current steering element of the selected memory element can be described as the following formula (3). In this formula, $I_{on}$ is the absolute value of the write current of the variable resistance element, and $V_{ON}$ is the absolute value of the voltage to be applied to the bidirectional current steering element to supply a current required for the write operation of the variable resistance element.

$$V_{ON}=a \times \text{Log}(I_{on})+b \quad (3)$$

When a total of all of currents flowing through first to third unselected memory elements on the paths each including the three unselected memory elements in the example of FIG. 5 is a leak current $I_{SNEAK}$, the currents flowing through the first to third unselected memory elements are $I_{SNEAK}/(N-1)$, $I_{SNEAK}/(N-1)(M-1)$, and $I_{SNEAK}/(M-1)$, respectively. When these current values are substituted in the formula (1), formulas (4) to (6) each representing a relationship between each of a voltage V1 applied to both ends of the first unselected memory element, a voltage V2 applied to both ends of the second unselected memory element, and a voltage V3 applied to both ends of the third unselected memory element, and a current flowing through the corresponding unselected memory element, are derived:

$$V1=a \times [\text{Log}\{I_{SNEAK}/(N-1)\}+b \quad (4)$$

$$V2=a \times [\text{Log}\{I_{SNEAK}/(N-1)(M-1)\}+b \quad (5)$$

$$V3=a \times [\text{Log}\{I_{SNEAK}/(M-1)\}+b \quad (6)$$

A relationship among the voltage Vw applied to the selected memory element, and the voltages V1, V2, V3 applied to the unselected memory elements, respectively, is expressed as a formula (7):

$$V_{ON}+VR=V1+V2+V3 \quad (7)$$

Then, from the relationship of the formulas (3) to (7), the leak current $I_{SNEAK}$ can be expressed as a formula (8):

$$\text{Log}(I_{SNEAK})=(2/3)\times\text{Log}\{(N-1)\times(M-1)\}+(1/3)\times\text{Log}(I_{on})-(1/3)\times(2\times b-VR)/a \quad (8)$$

A condition required to enable a stable write operation to occur in the non-volatile memory device may be such that the leak current $I_{SNEAK}$ is less than the current $I_{on}$ flowing through the selected memory cell. In this case, a relationship between $I_{on}$ and $I_{SNEAK}$ can be expressed as a formula (9):

$$\text{Log}(I_{on}) > \text{Log}(I_{SNEAK}) \quad (9)$$

Accordingly, from a relationship between the formula (8) and the formula (9), the formula (2) can be derived:

$$b-VR/2 > a \times [\text{Log}\{(N-1)\times(M-1)\}-\text{Log}(I_{on})] \quad (2)$$

Therefore, by using a bidirectional current steering element having a characteristic satisfying the formula (2), for example, the non-volatile memory device is able to inhibit the leak current which is varied depending on the write characteristic of the variable resistance element and the storage capacity and thus perform a stable write operation.

A current flowing during the write operation of the non-volatile memory device is a sum of the current $I_{on}$ flowing through the selected memory element and the leak current $I_{SNEAK}$. In view of electric power consumed during the write operation, for example, the current flowing though the selected memory element may be more than 10 times as great as the leak current. In this case, since $I_{on} > 10 \times I_{SNEAK}$, a relationship between $I_{on}$ and $I_{SNEAK}$ can be expressed as a formula (10):

$$\text{Log}(I_{on}/10) > \text{Log}(I_{SNEAK}) \quad (10)$$

$$\text{Log}(I_{on}) - 1 > \text{Log}(I_{SNEAK}) b - VR/2 > a \times [\text{Log }\{(N-1) \times (M-1)\} - \text{Log}(I_{on}) + 3/2] \quad (11)$$

By using a bidirectional current steering element having a characteristic satisfying the formula (11), for example, the non-volatile memory device is able to more effectively inhibit the leak current which is varied depending on the write characteristic of the variable resistance element and the storage capacity and thus perform a more stable write operation.

Although in the above described example, the current flowing though the selected memory element is more than 10 times as great as the leak current, it may be more than 5 times as great as the leak current. In this case, by conducting similar calculation, the relationship between $I_{on}$ and $I_{SNEAK}$ can be expressed as the following formula:

$$b - VR/2 > a \times [\text{Log }\{(N-1) \times (M-1)\} - \text{Log}(I_{on}) + 1.048] \quad (12)$$

Or, the current flowing though the selected memory element may be more than 50 times as great as the leak current. In this case, by conducting similar calculation, the relationship between $I_{on}$ and $I_{SNEAK}$ may be expressed as the following formula:

$$b - VR/2 > a \times [\text{Log }\{(N-1) \times (M-1)\} - \text{Log}(I_{on}) + 2.548] \quad (13)$$

Or, the current flowing though the selected memory element may be more than 100 times as great as the leak current. In this case, by conducting similar calculation, the relationship between $I_{on}$ and $I_{SNEAK}$ can be expressed as the following formula:

$$b - VR/2 > a \times [\text{Log }\{(N-1) \times (M-1)\} - \text{Log}(I_{on}) + 3] \quad (14)$$

By using a bidirectional current steering element having a characteristic satisfying the formula (12), the formula (13), and/or the formula (14), the non-volatile memory device is able to more effectively inhibit the leak current which is varied depending on the write characteristic of the variable resistance element and the storage capacity and thus perform a more stable write operation.

The bidirectional current steering element may be configured such that a Schottky junction is formed at an interface between the electrode and the current steering layer. In the Schottky junction, electric conduction in the bidirectional current steering element occurs by major carriers. This allows the bidirectional current steering element to easily supply a required write current to the variable resistance element. When a current-voltage characteristic of the bidirectional current steering element having an ideal Schottky junction state is expressed as the approximation formula (3), the coefficient a is 0.106. By setting a>0.106, the Schottky junction can be formed at the interface between the electrode and the current steering layer, which allows the bidirectional current steering element to easily supply the current required for write to the variable resistance element.

The coefficient b in the approximation formula (3) may be greater than zero. By setting b>0, the current-voltage characteristic of the bidirectional current steering element is roughly symmetric with respect to a positive or negative electric pulse, which makes it possible to more effectively control write disturb in the non-volatile memory device.

The range within which the current-voltage characteristic of the bidirectional current steering element can be approximated as the formula (1) is not limited to the range from the current value (about $10^{-7}$ [A]) which is three-digit smaller than the write current, to the write current, and may be, for example, a range from a current value (about $10^{-8}$ [A]) which is four-digit smaller than the write current, to the write current.

[Configuration of Memory Element]

Figure 6:
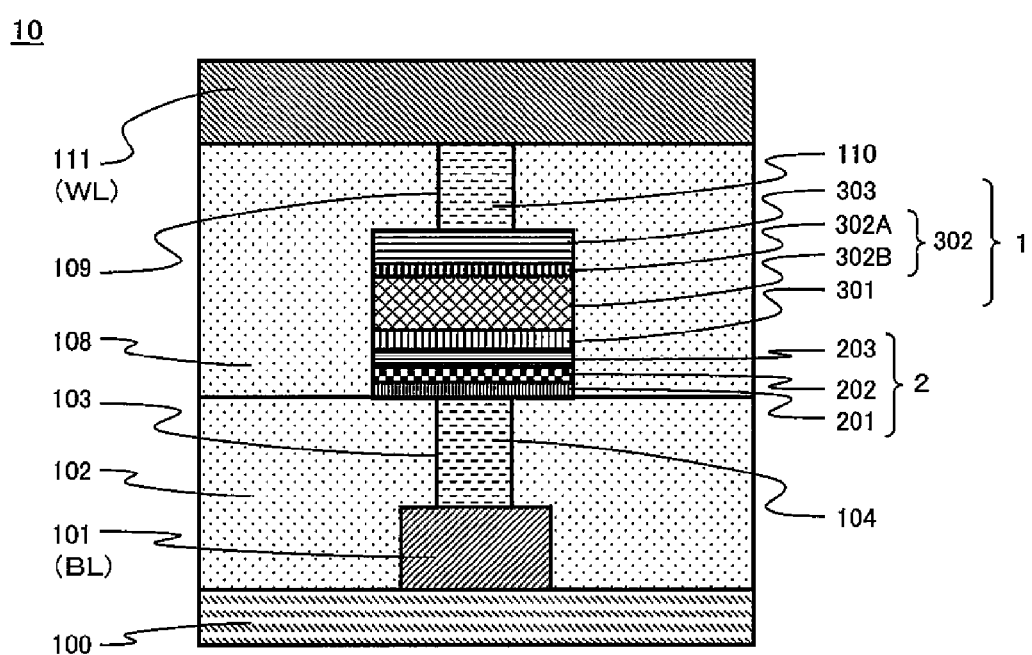
FIG. 6 is a cross-sectional view showing an exemplary schematic configuration of a memory element of Embodiment 1.

FIG. 6 is a cross-sectional view showing an exemplary schematic configuration of the memory element of Embodiment 1. The configuration of the memory element described below is merely an example of the memory element of Embodiment 1, and the present embodiment is not limited to the example described below.

As shown in FIG. 6, the memory element 10 of the present embodiment may include a substrate 100, a first wire 101 (bit line BL), a first interlayer insulating layer 102, a first contact plug 104, the bidirectional current steering element 2, the variable resistance element 1, a second interlayer insulating layer 108, a second contact plug 110, and a second wire 111 (word line WL).

The bidirectional current steering element 2 may include a first electrode 201, a second electrode 203, and a current steering layer 202 disposed between the first electrode 201 and the second electrode 203 such that the current steering layer 202 is physically in contact with the first electrode 201 and the second electrode 203.

The variable resistance element 1 may include a third electrode 301, a fourth electrode 303, and a variable resistance layer 302 disposed between the third electrode 301 and the fourth electrode 303. The variable resistance element 1 is a bipolar variable resistance element.

The substrate 100 may be a semiconductor substrate comprising silicon (Si) and the like.

The first wire 101 may be a wire formed on and above the substrate 100. The first wire 101 may correspond to, for example, the bit line BL of FIG. 2.

The first interlayer insulating layer 102 may be an interlayer insulating layer comprising a silicon oxide layer and the like having a thickness of 500 to 1000 nm and covering the first wire 101 formed on and above the substrate 100.

The first contact hole 103 may be a contact hole formed to penetrate the first interlayer insulating layer 102 and have a diameter of 50 to 300 nm such that the first contact plug 104 electrically connected to the first wire 101 is filled into the first contact hole 103. The first contact plug 104 may be an electric conductor filled into the first contact hole 103 and comprising tungsten as a major component.

The bidirectional current steering element 2 may be formed to cover an upper end surface of the first contact plug 104, and include the first electrode 201, the second electrode 203, and the current steering layer 202 disposed between the first electrode 201 and the second electrode 203.

Each of the first electrode 201 and the second electrode 203 may comprise at least one metal selected from a group consisting of Al, Cu, Ti, W, Pt, Ir, Cr, Ni, and Nb, a mixture (alloy) of these metals, or a laminate structure of these metals. Each of the first electrode 201 and the second electrode 203 may comprise at least one of electrically conductive compounds which is selected from a group consisting of TiN, TiW, TaN, $TaSi_2$, TaSiN, TiAlN, NbN, WN, $WSi_2$, WSiN, $RuO_2$, $In_2O_3$, $SnO_2$, and $IrO_2$, a mixture of these electrically conductive compounds, or a laminate structure of these electrically conductive compounds. As a matter of course, the materials of the first electrode 201 and the second electrode 203 are not limited to these materials. The materials of the first electrode 201 and the second electrode 203 may be materials which allow a steering action to proceed by potential barriers formed between the first electrode 201 and the second electrode 203, and the current steering layer 202.

In the bidirectional current steering element 2, the current steering layer 202 may comprise $SiN_x$ ($0<x \leq 0.85$). By varying a content of nitrogen in $SiN_x$, a band gap can be continuously varied. Therefore, a height of the potential barriers formed between the first electrode 201 and the second electrode 203, and the current steering layer 202 in contact with the first electrode 201 and the second electrode 203, can be controlled by varying a value of x. Alternatively, the current steering layer 202 may comprise an oxide comprising $TiO_2$, $VO_2$, or ZnO, a compound which is a mixture of any of these oxides and Ta, Nb or W, a laminate structure of the above oxide or compound, a laminate structure of the above oxide or compound and $SiN_x$ ($0<x \leq 0.85$). By using the oxide for the current steering layer 202, the band gap can be widened, the potential barriers with a greater height can be formed between the first electrode 201 and the second electrode 203, and the current steering layer 201 in contact with the first electrode 201 and the second electrode 203, and an off-characteristic can be improved. Moreover, by using as the current steering layer 202, the oxide $TiO_2$, $VO_2$, or ZnO containing Ta, Nb or W, Ta ions, Nb ions or W ions, substitute for metal ions (Ti ions, V ions, Z ions) constituting the oxide, hopping sites of the current are formed inside of the oxide. This makes it possible to easily flow the current through the oxide. As a result, a drive current of the bidirectional current steering element can be increased.

Figure 7:
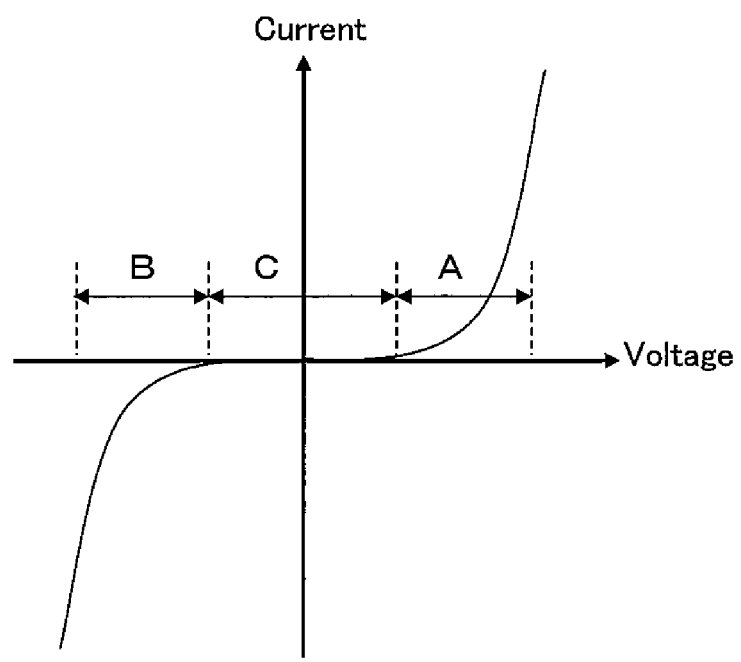
FIG. 7 is a view schematically showing an exemplary current-voltage characteristic of the bidirectional current steering element.

FIG. 7 is a view schematically showing an exemplary current-voltage characteristic of the bidirectional current steering element. The bidirectional current steering element of FIG. 7 has a very high electric resistance in a range (i.e., range C of FIG. 7) in which an applied voltage is equal to or smaller than a first critical voltage (lower limit voltage in a range A of FIG. 7) and is equal to or greater than a second critical voltage (upper limit voltage in a range B of FIG. 7). In contrast, the bidirectional current steering element of FIG. 7 drastically decreases its electric resistance in a range in which the applied voltage exceeds the first critical voltage or a range in which the applied voltage falls below the second critical voltage. The first critical voltage and the second critical voltage have a substantially equal absolute value. The resistance values corresponding to a positive voltage and a negative voltage which are equal in absolute value are substantially equal. In other words, the bidirectional current steering element of FIG. 7 has a non-linear and bidirectional electric resistance characteristic in which it does not substantially flow a current (has a greater resistance value) in the range in which the applied voltage is equal to or greater than the second critical voltage and in the range in which the applied voltage is equal to or smaller than the first critical voltage, and is able to flow a current with a great magnitude (has a smaller resistance value: hereinafter this state in which a current with a great magnitude flows will be referred to as "conductive state") in the range in which the applied voltage exceeds the first critical voltage or in the range in which the applied voltage falls below the second critical voltage. The bidirectional current steering element of FIG. 7 has an electric resistance characteristic which is symmetric with respect to an original point (current is zero and voltage is zero).

As described above, the bidirectional current steering element may be an element which exhibits a current-characteristic which is non-linear [in which the resistance value is greater in a range (lower-voltage range) in which the absolute value of the voltage is smaller and the resistance value is smaller in a range (higher-voltage range) in which the absolute value of the voltage is greater] with respect to both of positive and negative voltages.

The variable resistance element 1 may be formed on and above the bidirectional current steering element 2 and may include the third electrode 301, the fourth electrode 303, and a variable resistance layer 302 disposed between the third electrode 301 and the fourth electrode 303.

The fourth electrode 303 may comprise a material having a higher standard electrode potential than metal constituting the variable resistance layer 302. The fourth electrode 303 may comprise, for example, at least one metal selected from a group consisting of platinum (Pt) and iridium (Ir).

The third electrode 301 may comprise a material having a lower standard electrode potential than the material constituting the fourth electrode 303. The third electrode 301 may comprise, for example, tantalum nitride (TaN) and the like.

When the variable resistance layer 302, the third electrode 301 and the fourth electrode 303 satisfy the above stated standard electrode potential relationship, a resistance changing phenomenon is enabled to selectively occur in a region of the variable resistance layer 302 which is in the vicinity of the fourth electrode 303.

The variable resistance layer 302 may comprise an oxygen-deficient transition metal oxide. For example, the variable resistance layer 302 may comprise an oxygen-deficient tantalum oxide. In this case, the variable resistance layer 302 may have a stacked-layer structure including a first transition metal oxide layer 302B having a composition expressed as $TaO_x$ ($0<x<2.5$) and a second transition metal oxide layer 302A having a composition expressed as $TaO_y$ ($x<y$).

Furthermore, $TaO_x$ may satisfy $0.8 \leq x \leq 1.9$ and $TaO_y$ may satisfy $2.1 \leq y \leq 2.5$. In this configuration, the variable resistance element is enabled to perform a more stable operation.

For example, the variable resistance layer 302 may have a stacked-layer structure including a first transition metal oxide layer 302B having a composition expressed as $TaO_x$ (x=1.5) and a second transition metal oxide layer 302A having a composition expressed as $TaO_y$ (y=2.3).

The second transition metal oxide layer 302A may have a thickness which is equal to or greater than 1 nm and equal to or less than 10 nm. This allows an initial break to be more easily implemented. For example, the tantalum oxide layer used as the second transition metal oxide layer may have a thickness of 5 nm.

The second interlayer insulating layer 108 may be an interlayer insulating layer formed to cover the variable resistance element 1 and the bidirectional current steering element 2 and comprising a silicon oxide layer and the like having a thickness of 500 to 1000 nm.

The second contact hole 109 may be a contact hole formed to penetrate the second interlayer insulating layer 108 and have a diameter of 50 to 300 nm such that the second contact plug 110 electrically connected to the upper electrode 107 is filled into the second contact hole 109.

The second contact plug 110 may be an electric conductor filled into the second contact hole 109 and comprising tungsten as a major component.

The second wire 111 may be a wire formed on and above the second interlayer insulating layer 108 such that the second wire 111 covers the second contact plug 110. The second wire 111 may correspond to, for example, the word line WL of FIG. 2.

It should be noted that constituents (substrate 100, first wire 101, first interlayer insulating layer 102, first contact hole 103, first contact plug 104, second interlayer insulating layer 108, second contact hole 109, second contact plug 110, second wire 111, etc.) other than the bidirectional current steering element 2 and the variable resistance element 1, may be omitted from the memory element 10 of the present embodiment.

Although in the example of FIG. 6, the second electrode 203 of the bidirectional current steering element 2 and the third electrode 301 of the variable resistance element 1 are separate constituents, they may be configured as an identical member in a case where they may comprise the same material, for example.

Although in the example of FIG. 6, the variable resistance element 1 and the bidirectional current steering element 2 are stacked together, the present invention is not limited to this configuration. For example, the variable resistance element 1 and the bidirectional current steering element 2 may be connected to each other via a contact plug.

Although in the example of FIG. 6, the memory element 10 is connected to the first wire 101 and the second wire 111 via the first contact plug 104 and the second plug 110, respectively, the present invention is not limited to this configuration. For example, the first wire 101 and the memory element 10 (to be precise, for example, first electrode 201 of bidirectional current steering element 2) may be physically directly in contact with each other. The second wire 111 and the memory element 10 (to be precise, for example, fourth electrode 303 of variable resistance element 300) may be physically directly in contact with each other.

Which of the first wire 101 and the second wire 111 is used as the bit line BL and which of the first wire 101 and the second wire 111 is used as the word line WL are not particularly limited. Which of the first wire 101 and the second wire 111 the variable resistance element 1 is connected to and which of the first wire 101 and the second wire 111 the bidirectional current steering element 2 is connected to are not particularly limited.

[Manufacturing Method of Memory Element]

FIGS. 8A to 8E and FIG. 9A to FIG. 9C are cross-sectional views showing an exemplary manufacturing method of the memory element 10 of Embodiment 1.

Figure 8A:
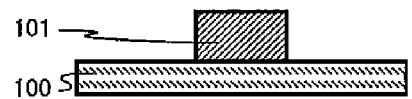
FIG. 8A is a cross-sectional view showing an exemplary manufacturing method of the memory element of Embodiment 1, and showing the step of forming a first wire.

As shown in FIG. 8A, in the step of forming the first wire 101, an electrically conductive layer comprising aluminum and the like and having a thickness of 400 to 600 nm may be formed on and above the substrate 100 provided with a transistor, a lower wire, and the like, and may be patterned to form the first wire 101.

Figure 8B:
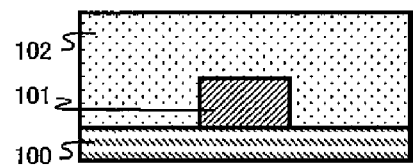
FIG. 8B is a cross-sectional view showing an exemplary manufacturing method of the memory element of Embodiment 1, and showing the step of forming a first interlayer insulating layer.

Then, as shown in FIG. 8B, in the step of forming the first interlayer insulating layer 102, an insulating layer may be formed on and above the substrate 100 to cover the first wire 101 and then its obverse surface may be planarized, to form the first interlayer insulating layer 102 having a thickness of 500 to 1000 nm. The first interlayer insulating layer 102 may comprise a plasma TEOS (tetraethoxysilane) layer, a fluorine-containing oxide (e.g., FSG (fluorinated silicate glass)), or low-k material to reduce a parasitic capacitance between the wires.

Figure 8C:
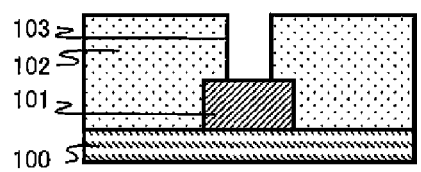
FIG. 8C is a cross-sectional view showing an exemplary manufacturing method of the memory element of Embodiment 1, and showing the step of forming a first contact hole.

Then, as shown in FIG. 8C, in the step of forming the first contact hole 103, the first contact hole 103 having sides of 50 to 300 nm may be formed to penetrate the first interlayer insulating layer 102 and reach the first wire 101, by patterning using a desired mask.

The first wire 101 may have a greater width than the first contact hole 103. In this configuration, an area of a portion of the first wire 101 and a portion of the first contact plug 104, which portions are in contact with each other, is less likely to vary even if mask misalignment occurs, and for example, a cell current is less likely to vary.

Figure 8D:
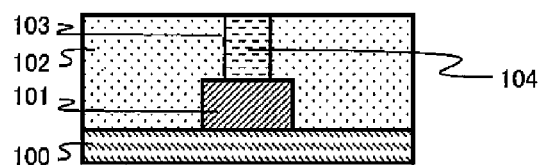
FIG. 8D is a cross-sectional view showing an exemplary manufacturing method of the memory element of Embodiment 1, and showing the step of forming a first contact plug.

Then, as shown in FIG. 8D, in the step of forming the first contact plug 104, Ti/TiN layers each having a thickness of 5 to 30 nm and serving as an adhesive layer and a diffusion barrier, may be deposited as a lower layer by sputtering, and then tungsten (W) which has a thickness of 200 to 400 nm and will become a major component of the contact plug may be deposited as an upper wire by CVD (chemical vapor deposition). At this time, the first contact hole 103 may be filled with the electrically conductive layer (W/Ti/TiN structure) having the stacked-layer structure which will become the first contact plug 104 later.

Then, in the step of forming the first contact plug 104, an entire wafer surface may be planarized by polishing using CMP (chemical mechanical polishing), to remove an unnecessary portion of the electrically conductive layer on and above the first interlayer insulating layer 102, thereby leaving the first contact plug 104 filled into the first contact hole 103.

Figure 8E:
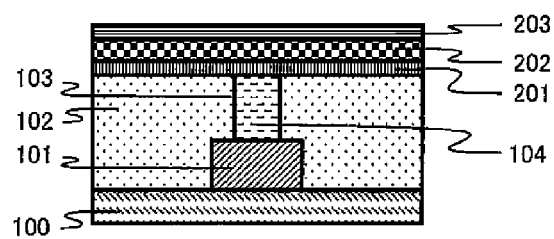
FIG. 8E is a cross-sectional view showing an exemplary manufacturing method of the memory element of Embodiment 1, and showing the step of forming a stacked-layer structure which is a base structure of a MSM current steering element.

Then, as shown in FIG. 8E, in the step of forming a stacked-layer structure which is a base material layer of the bidirectional current steering element 2, firstly, the first electrode 201 may be formed on and above the first interlayer insulating layer 102 to cover the first contact plug 104. Deposition conditions for the first electrode 201 may be varied depending on an electrode material used for the first electrode 201, etc. For example, in a case where tantalum nitride (TaN) is used as the material of the first electrode, reactive sputtering may be performed using a tantalum (Ta) target in an atmosphere of a mixture of argon (Ar) and nitrogen (N), by DC magnetron sputtering, for a time adjusted so that tantalum nitride having a thickness of 20 to 100 nm is deposited.

Then, on and above a main surface of the first electrode 201, a $SiN_x$ layer as the current steering layer 202 may be formed. The $SiN_x$ layer may be deposited by, for example, sputtering (reactive sputtering) using a polycrystalline silicon target in an atmosphere of a mixture gas of Ar and nitrogen. Typical deposition conditions may be such that a pressure is 0.08 to 2 Pa, a substrate temperature is 20 to 300 degrees C., a flow ratio of a nitrogen gas (ratio of a flow of nitrogen to a total flow of Ar and nitrogen) is 0 to 40%, and a DC power is 100 to 1300 W, and deposition time is adjusted so that the $SiN_x$ layer having a thickness of 3 to 30 nm is deposited.

The value of x in the $SiN_x$ layer may be suitably controlled by varying the condition (gas flow ratio between Ar and nitrogen, etc.) for sputtering using the polycrystalline silicon target.

The current steering layer 202 may comprise any one of the oxides which are $TiO_2$ layer, $VO_2$ layer, and ZnO layer. These layers may be deposited by, for example, sputtering (reactive sputtering) using a titanium target in an atmosphere of a mixture gas of Ar and oxygen for a time adjusted so that the oxide having a thickness of 3 to 60 nm is deposited.

Then, on and above a main surface of the current steering layer 202, the second electrode 203 may be formed. Deposition conditions for the second electrode 203 may be the same as those for the first electrode 201, and therefore will not be described in detail in repetition.

Figure 9A:
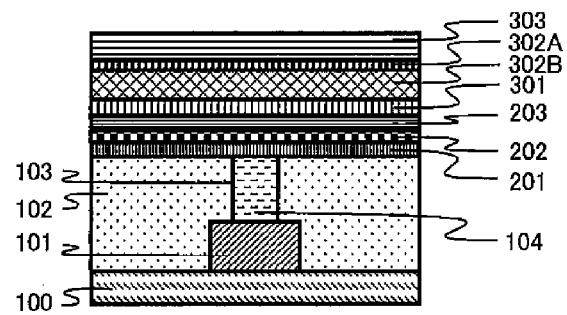
FIG. 9A is a cross-sectional view showing an exemplary manufacturing method of the memory element of Embodiment 1, and showing the step of forming a stacked-layer structure which is a base structure of a variable resistance element.

Then, as shown in FIG. 9A, in the step of forming a stacked-layer structure which is a base material layer of the variable resistance element 1, on and above the second electrode 203, an electrically-conductive layer which comprises tantalum nitride, and the like, has a thickness of 20 to 100 nm, and will become the third electrode 301, may be deposited by sputtering.

Then, the first transition metal oxide layer 302B comprising the second transition metal oxide is formed. The first transition metal oxide layer 302B may be deposited by, for example, sputtering using a tantalum target in an atmosphere of argon and oxygen, i.e., reactive sputtering. When a composition of the second transition metal oxide is expressed as $TaO_x$, the second transition metal may have an oxygen content atomic percentage of 55 to 65 atm % (in this case, the value of x is 1.22 to 1.86), a resistivity of 1 to 50 mΩ·cm, and a thickness of 20 to 100 nm.

Then, the second transition metal oxide layer 302A comprising the first transition metal oxide is formed. The second transition metal oxide layer 302A may be deposited by, for example, sputtering using a tantalum target in an atmosphere of argon and oxygen, i.e., reactive sputtering. When a composition of the first transition metal oxide is expressed as $TaO_y$, the first transition metal may have an oxygen content atomic percentage of 68 to 71 atm % (in this case, the value of y is 2.1 to 2.5), a resistivity of 1E 7 mΩ·cm or greater, and a thickness of 3 to 10 nm.

By forming the first transition metal oxide layer 302B and the second transition metal oxide layer 302A in the above described manner, the stacked-layer structure of the first transition metal oxide layer 302B and the second transition metal oxide layer 302A enables the resistance change to occur effectively.

Then, an electrically-conductive layer which will become the fourth electrode 303 and comprises precious metal (Pt, Ir, Pa, etc.) and the like, may be formed.

Figure 9B:
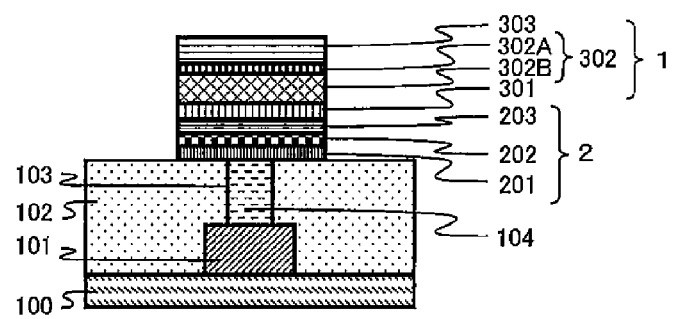
FIG. 9B is a cross-sectional view showing an exemplary manufacturing method of the memory element of Embodiment 1, and showing the steps of forming the MSM current steering element and the variable resistance element.

Then, as shown in FIG. 9B, in the step of forming the bidirectional current steering element 2 and the variable resistance element 1, the bidirectional current steering element 2 and the variable resistance element 1 may be formed by patterning using a mask.

Figure 9C:
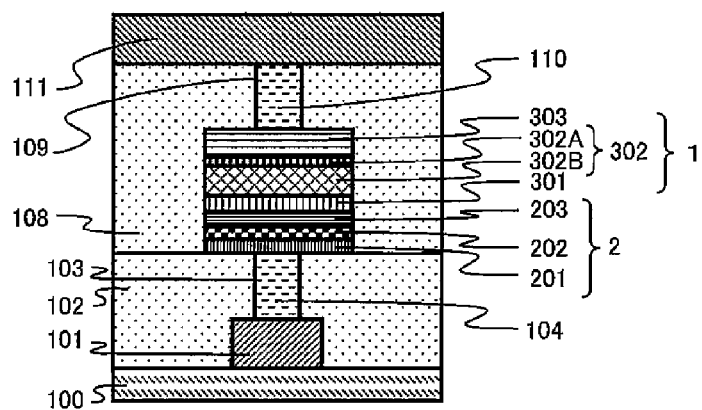
FIG. 9C is a cross-sectional view showing an exemplary manufacturing method of the memory element of Embodiment 1, and showing the step of forming a second interlayer insulating layer.

Finally, as shown in FIG. 9C, in the step of forming the second interlayer insulating layer 108, the second interlayer insulating layer 108 having a thickness of 500 to 1000 nm may be formed to cover the bidirectional current steering element 2 and the variable resistance element 1. By the same manufacturing method as that of FIGS. 8B and 8C, the second contact hole 109 and the second contact plug 110 may be formed. Thereafter, the second wire 111 may be formed to cover the second contact plug 110, thereby completing the memory element 10.

A memory cell array including the memory elements 10 arranged in matrix may be formed, and may be connected to a word line decoder, a bit line decoder, and a read circuit, thereby manufacturing the cross-point non-volatile memory device.

[Operation]

Figure 10A:
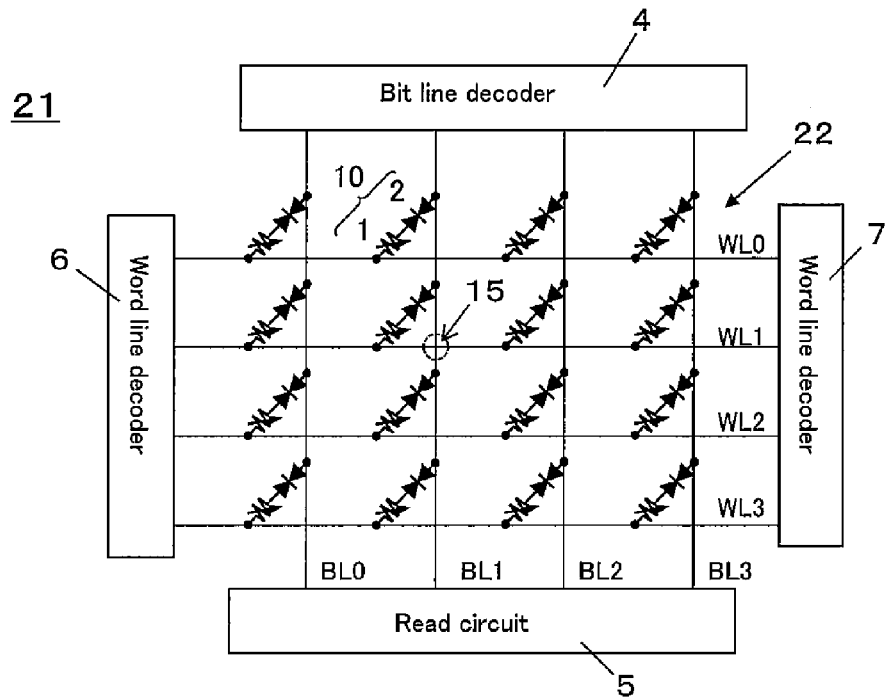
FIG. 10A is a block diagram showing an exemplary schematic configuration of the non-volatile memory device of Embodiment 1.
Figure 10B:
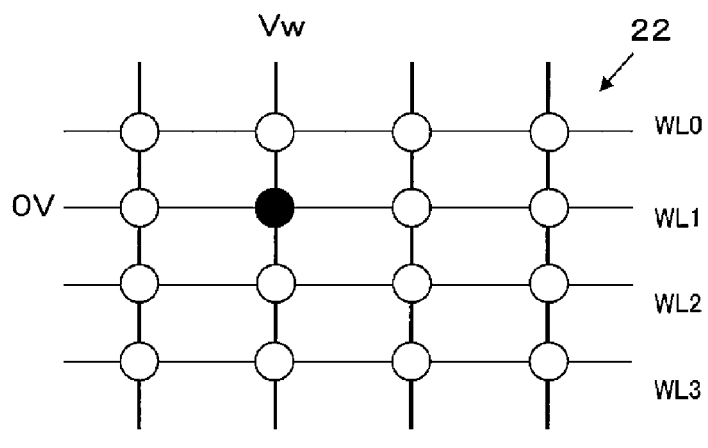
FIG. 10B is a view showing an operation of the non-volatile memory device of Embodiment 1.

FIG. 10A is a block diagram showing an exemplary schematic configuration of the non-volatile memory device 21 of Embodiment 1. FIG. 10B is a view showing an operation of the non-volatile memory device 21 of Embodiment 1. The memory elements 10, the variable resistance elements 1, the bidirectional current steering elements 2, the bit lines BL and the word lines WL in FIGS. 10A and 10B may be the same as those described with reference to FIGS. 2 and 6, and therefore will not be described in detail in repetition.

In the example of FIG. 10A, the non-volatile memory device 21 includes a memory element array 22 including a plurality of memory elements 10 arranged in (N×M) matrix. Each of the memory elements 10 includes the variable resistance element 1 and the bidirectional current steering element 2 connected in series with the variable resistance element 1. The non-volatile memory device 21 includes the bit line decoder 4, the read circuit 5, and the word line decoders 6 and 7.

The operation of the non-volatile memory device 21 of Embodiment 1 of FIG. 10A may be controlled by a controller (not shown). When a write command is input from the controller to the non-volatile memory device 21, the bit line decoder 4 selects any one of the bit lines $BL_0$ to $BL_3$ of an address specified by the write command (hereinafter the selected bit line will be expressed as BL). The word line decoder 6, 7 selects any one of the word lines $WL_0$ to $WL_3$ of the address specified by the write command (hereinafter the selected word line will be expressed as WL). In this way, the memory element 10 to which data is to be written is selected.

Then, the bit line decoder 4 and the word line decoder 6, 7 cooperate with each other to apply an electric pulse of a write voltage having an absolute value Vw, corresponding to data ("1" or "0") specified by the write command, between the selected bit line BL and the selected word line WL. Thus, the specified data is written to the memory element 10 of the address specified by the write command.

When a read command is input from the above controller to the memory device 21, the bit line decoder 4 selects any one of the bit lines $BL_0$ to $BL_3$ of an address specified by the read command. The word line decoder 6, 7 selects any one of the word lines $WL_0$ to $WL_3$ of an address specified by the read command. In this way, the memory element 10 from which the data is to be read is selected. Then, the bit line decoder 4 and the word line decoder 6, 7 cooperate with each other to apply an electric pulse of a specified read voltage Vr, between the selected bit line BL and the selected word line WL. The read circuit 5 detects a current flowing through the selected bit line BL, and detects whether a value of the data stored in the selected memory element 3 is "1" or "0" based on the detected current. The read circuit 5 outputs the detected value "1" or "0" as the read data, to the controller.

Hereinafter, a specific application operation of the write voltage and a specific application operation of the read voltage Vr will be described with reference to the drawings. By way of example, a description will be given of the operation in a case where the memory element 10 located at a three-dimensional cross-point 15 of the bit line $BL_1$ and the word line $WL_1$ is selected, and the data is written to the selected memory element 10 (selected memory element).

In FIG. 10B, longitudinal lines represent the bit line $BL_0$, the bit line $BL_1$, the bit line $BL_2$, and the bit line $BL_3$, respectively, in this order, from the left. A value of a voltage applied to each bit line is depicted at an upper end of the bit line. The bit lines for which no value is depicted are in, for example, a floating state. Lateral lines represent the word line $WL_0$, the word line $WL_1$, the word line $WL_2$, and the word line $WL_3$, respectively, in this order, from the upper. A value of a voltage applied to each word line is depicted at a left end of the word line. The word lines for which no value is depicted are in, for example, a floating state.

As shown in FIG. 10B, absolute values of voltage differences at both ends of the memory elements 10 located at the three-dimensional cross-points of the bit lines $BL_0$ to $BL_3$ and the word lines $WL_0$ to $WL_3$ constituting the memory element array 22 in (4×4) matrix, are represented by graphics (black circle and while circles) at cross-points of the longitudinal lines and the lateral lines. The voltage Vw is applied to the memory element at the cross-point represented by the black circle. The memory elements at the cross-points represented by the white circles are connected to the bit lines or the word lines in the floating state.

Specifically, in the present embodiment, the bit line decoder 4 applies the write voltage Vw to the bit line $BL_1$ connected to the selected element. In addition, the word line decoder 7 applies a voltage 0 to the word line $WL_1$ connected to the selected element. This allows the bidirectional current steering element 2 of the memory element 10 which is the selected element to be placed in a conductive state. Thereby, a current enough to cause the variable resistance element 1 to change its resistance state flows through the variable resistance element 1, so that the resistance value of the variable resistance element 1 changes to a value corresponding to the high-resistance state or to a value corresponding to the low-resistance state.

In contrast, another memory elements 10 (memory elements 10 located at the three-dimensional cross-points of the bit line $BL_1$ and the word line $WL_0$, the word line $WL_2$, and the word line $WL_3$), which are connected to the bit line to which the selected element is connected, and connected to the word lines different from the word line to which the selected element is connected, i.e., other memory elements 10 belonging to a column to which the selected element belongs, are the unselected elements, because only the bit line is selected, from among the bit lines and the word lines. The bit line decoder 4 applies the write voltage Vw to the bit line $BL_1$ connected to these unselected elements (only bit line is selected), as in the selected element.

Also, other memory elements 10 (memory elements 10 located at the three-dimensional cross-points of the word line $WL_1$, and the bit line $BL_0$, the bit line $BL_2$, and the bit line $BL_3$), which are connected to the word line to which the selected element is connected, and connected to the bit lines different from the bit line to which the selected element is connected, i.e., other memory elements 10 belonging to a row to which the selected element belongs, are the unselected elements, because only the word line is selected, from among the bit lines and the word lines. The word line decoder 7 causes the word line $WL_1$ connected to the unselected elements (only word line is selected) to be placed in, for example, floating state as in the selected element.

In the present embodiment, it is designed so that the current flowing via the unselected elements is cut off by the bidirectional current steering elements 2 included in the memory elements. Because of this, the current flowing through the unselected elements is small in magnitude. This reduces a possibility that the data is written by mistake to the variable resistance elements 1 included in the unselected elements. Therefore, it becomes possible to more surely write the data only to the selected memory element.

EXAMPLE 1

In Example 1, study was conducted for a relationship among the coefficient a, the coefficient b and the thickness d (nm) of the current steering layer in a case where the current-voltage characteristic of the MSM current steering element (electrode material=tantalum nitride, size of electrode=0.38 μm×0.38 μm) including the current steering layer comprising $SiN_x$ is approximated as $|V_0|=a\times Log(I)+b$. Experiment was conducted for two kinds of elements of x=0.3 and x=0.6.

Figure 11A:
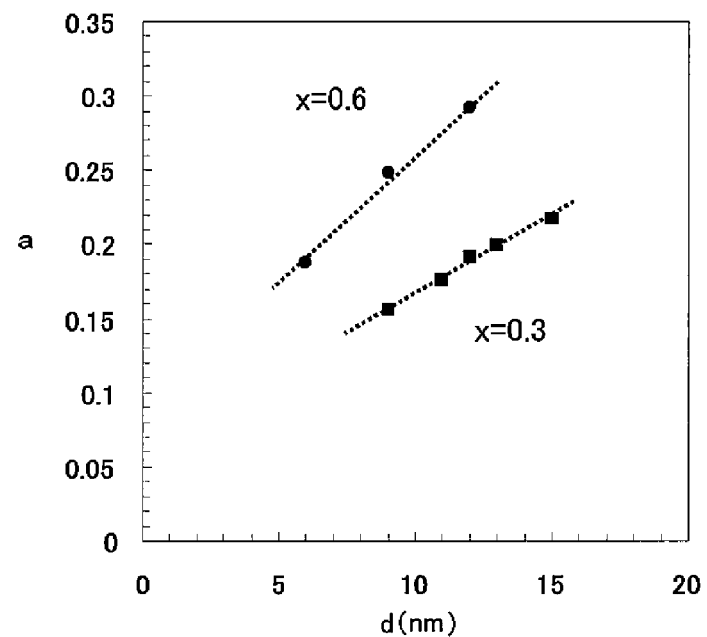
FIG. 11A is a graph showing a relationship between a coefficient a and a thickness d (nm) of a current steering layer in Example 1.
Figure 11B:
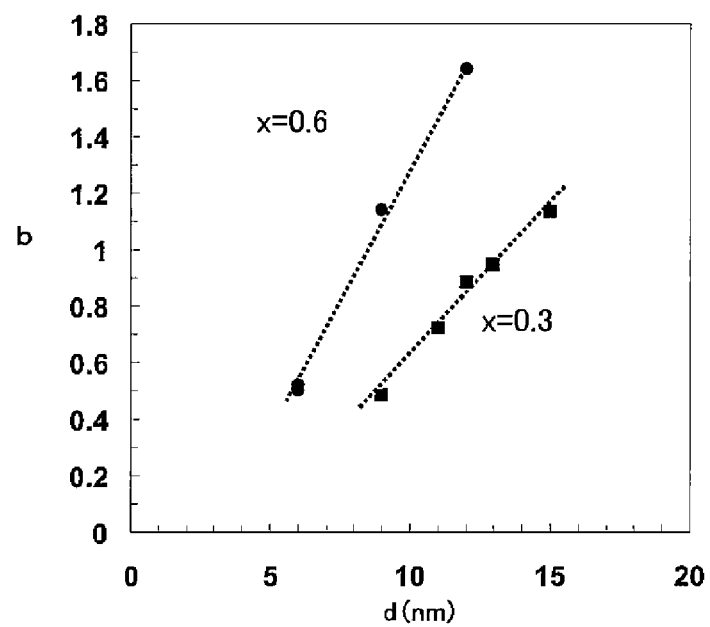
FIG. 11B is a graph showing a relationship between a coefficient b and the thickness d (nm) of the current steering layer in Example 1.

FIG. 11A is a graph showing a relationship between the coefficient a and the thickness d (nm) of the current steering layer in Example 1. FIG. 11B is a graph showing a relationship between the coefficient b and the thickness d (nm) of the current steering layer in Example 1.

As shown in FIGS. 11A and 11B, by controlling the nitrogen content ratio x of the current steering layer and the thickness d (nm) of the current steering layer, the current-voltage characteristic of the MSM current steering element can be adjusted. The coefficient a and the coefficient b in a case where the current-voltage characteristic of the MSM current steering element is approximated as $|V_0|=a\times Log(I)+b$, can be controlled to become desired values.

Figure 12A:
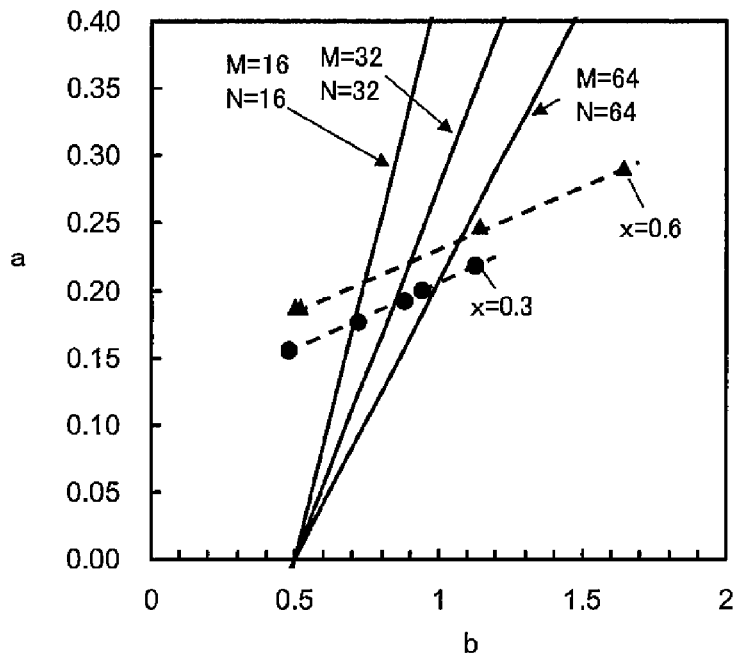
FIG. 12A is a graph showing a range of the coefficient a and a range of the coefficient b which satisfy a formula (2), in a case where a size of a memory element array is varied with a characteristic of the variable resistance element fixed, in Example 1.

FIG. 12A is a graph showing a range of the coefficient a and a range of the coefficient b which satisfy the formula (2), in a case where the size of the memory element array is varied with the characteristic of the variable resistance element fixed, in Example 1. The characteristic of the variable resistance element was such that the write voltage was 1.0V and the write current was 140 μA.

In the example of FIG. 12A, regions which are rightward relative to straight lines defined by the number (M) of bit lines and the number (N) of word lines (M=16 and N=16; M=32 and N=32; M=64 and N=64) are the range of the coefficient a and the range of the coefficient b which satisfy the inequation of the formula (2). As shown in FIG. 12A, the range of the coefficient a and the range of the coefficient b which satisfy the formula (2), are varied depending on the number (M) of bit lines and the number (N) of word lines. In FIG. 12A, plots of x=0.3 and x=0.6 are values of the coefficient a and the coefficient b of the MSM current steering element in the experiment shown in FIGS. 11A and 11B.

Figure 12B:
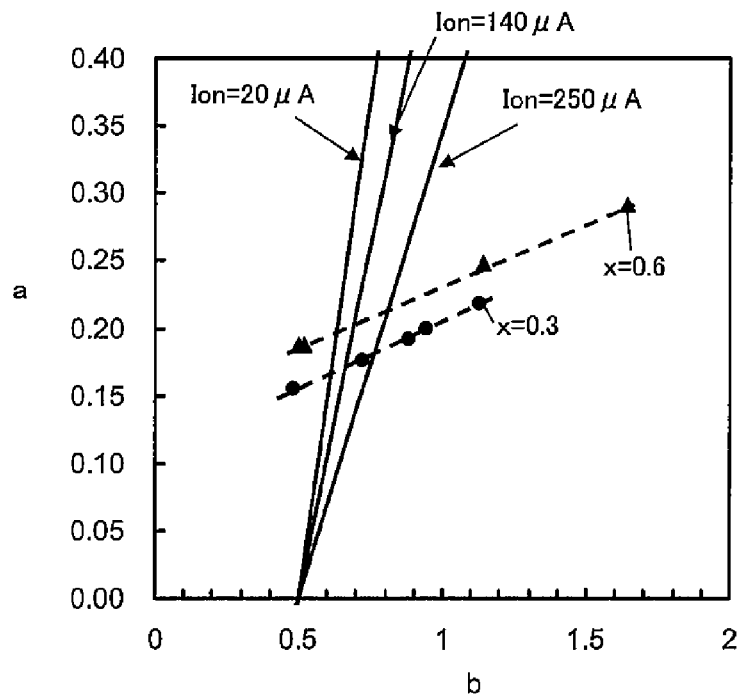
FIG. 12B is a graph showing a range of the coefficient a and a range of the coefficient b which satisfy the formula (2), in a case where the characteristic of the variable resistance element is varied with the size of the memory element array fixed, in Example 1.

FIG. 12B is a graph showing a range of the coefficient a and a range of the coefficient b which satisfy the formula (2), in a case where the characteristic of the variable resistance element is varied with the size of the memory element array fixed, in Example 1. The size of the memory element array was 256 bits (M=16 and N=16), and the write voltage of the variable resistance element was 1.0V. As shown in FIG. 12B, the range of the coefficient a and the range of the coefficient b which satisfy the formula (2), are varied depending on the write characteristic of the variable resistance element of the non-volatile memory device. In FIG. 12B, plots of x=0.3 and x=0.6 are values of the coefficient a and the coefficient b of the MSM current steering element in the experiment shown in FIGS. 11A and 11B.

As can be seen from FIGS. 12A and 12B, by appropriately adjusting M, N, d, x, the write voltage of the variable resistance element, and $I_{on}$, the non-volatile memory device satisfying the formula (2) could be designed.

EXAMPLE 2

From the relationship between the coefficient a, the thickness d (nm) of the current steering layer and the nitrogen content ratio x of the current steering layer, in Example 1, as shown in FIG. 11A, the relationship between the coefficient b, the thickness d (nm) of the current steering layer and the nitrogen content ratio x of the current steering layer, in Example 1, as shown in FIG. 11B, and an experiment value of x=0.15 (another parameters are similar to those of Example 1), a formula (15) and a formula (16) are derived:

$$a=(0.0071\times\exp(1.47\times x)\times d)+(0.0484\times x+0.055) \quad (15)$$

$$b=(0.071\times\exp(1.62\times x)\times d)-(0.4485\times x+0.3509) \quad (16)$$

Using the above formulas, for each value of x for which no experiment was conducted, a relationship among x, d, the coefficient a and the coefficient b can be derived.

In the present example, study was conducted for a case where the thickness d of the current steering layer was varied in a range of 3 nm to 30 nm and the nitrogen content ratio x of the current steering layer was varied in a range of 0<x≤0.85, in the MSM current steering element (electrode material=tantalum nitride, size of electrode=0.38 μm×0.38 μm) including the current steering layer comprising $SiN_x$.

Figure 13A:
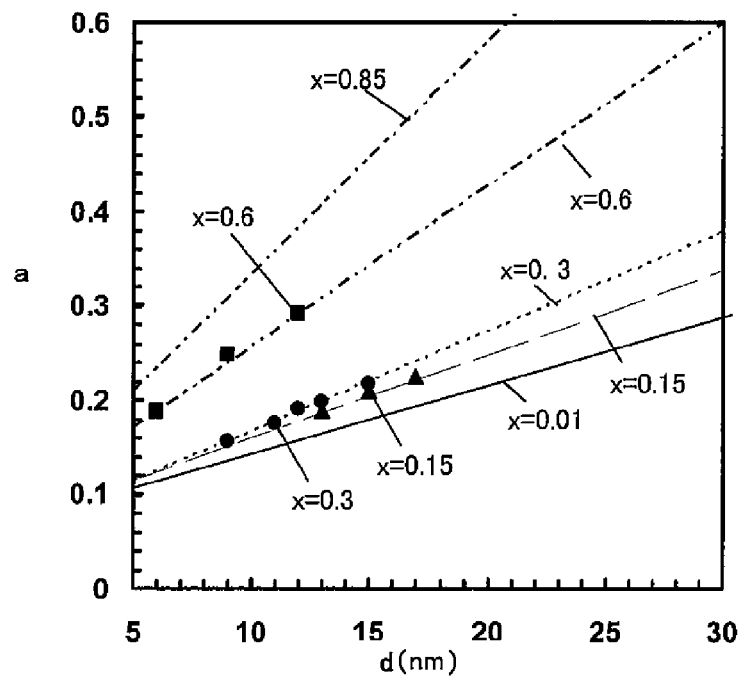
FIG. 13A is a view showing a relationship among the coefficient a calculated using the formula (12), x, and d (nm), in Example 2.

FIG. 13A is a view showing a relationship among the coefficient a calculated using the formula (15), x, and d (nm) in Example 2. As shown in FIG. 13A, by using the formula (15), it becomes possible to know how the coefficient a varies as the value of x and the value of d vary.

Figure 13B:
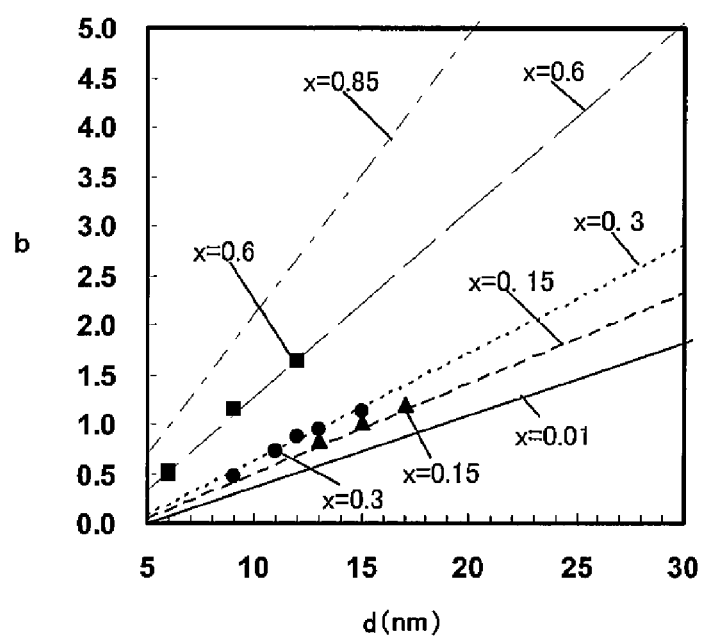
FIG. 13B is a view showing a relationship among the coefficient b calculated using the formula (13), x, and d (nm), in Example 2.

FIG. 13B is a view showing a relationship among the coefficient b calculated using the formula (16), x, and d (nm), in Example 2. As shown in FIG. 13B, by using the formula (16), it becomes possible to know how the coefficient b varies as the value of x and the value of d vary.

By making the thickness d of the current steering layer comprising $SiN_x$ greater than 3 nm, occurrence of a tunneling phenomenon which would be caused by reduction of the layer thickness can be controlled, and an OFF-current can be cut off more effectively. By setting d smaller than 30 nm, reduction of the current flowing through the MSM current steering element can be controlled, and the MSM current steering element can easily supply the current corresponding to the write current $I_{on}$ of the variable resistance element.

Figure 14A:
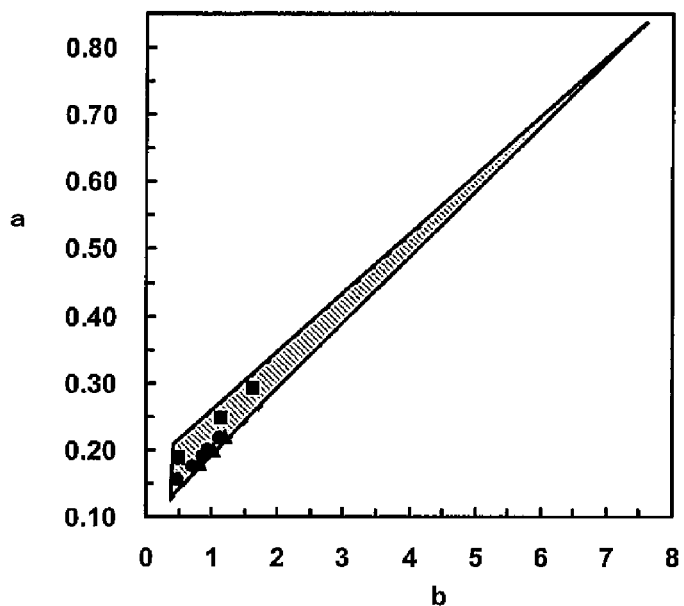
FIG. 14A is a view showing a range into which the coefficient a found with reference to FIG. 13A may fall and a range into which the coefficient b found with reference to FIG. 13B may fall.
Figure 14B:
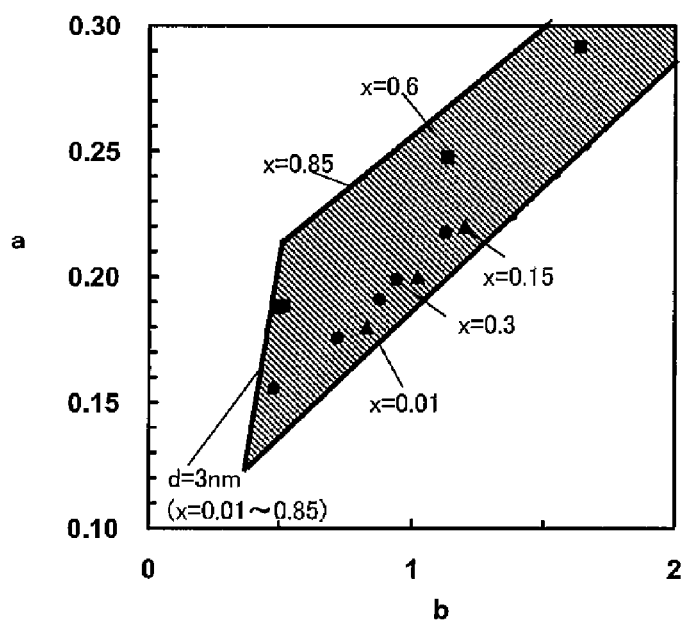
FIG. 14B is an enlarged view of a major part in FIG. 14A.

FIG. 14A is a view showing a range into which the coefficient a found with reference to FIG. 13A may fall and a range into which the coefficient b found with reference to FIG. 13B may fall. Plots are experiment values in the case of x=0.3 and x=0.6 shown in Example 1. FIG. 14B is an enlarged view of a major part in FIG. 14A.

Hatched portions in FIGS. 14A and 14B are the range into which the coefficient a may fall and the range into which the coefficient b may fall, the coefficient a and the coefficient b satisfying the formula (2), in the MSM current steering element including the current steering layer comprising $SiN_x$ (3 nm≤d≤30 nm, 0<x≤0.85).

Next, based on the above range into which the coefficient a may fall and the above range into which the coefficient b may fall, in the current steering layer comprising $SiN_x$, and the formula of the relationship between the coefficient a and the coefficient b derived using the formula (2), the coefficient a and the coefficient b which satisfy both of them are selected.

In FIG. 14B, ● plot at rightmost and lowermost point is a=0.155 and b=0.48. In FIG. 14B, ■ plot at rightmost and uppermost point is a=0.291 and b=1.64.

With reference to FIG. 14B, a≥0.155 may be satisfied. Also, b≥0.48 may be satisfied.

Or, with reference to FIG. 14B, a≤0.291 may be satisfied. Also, b≤1.64 may be satisfied.

Or, with reference to FIG. 14B, 0.155≤a≤0.291 may be satisfied. Also, 0.48≤b≤1.64 may be satisfied.

Figure 15:
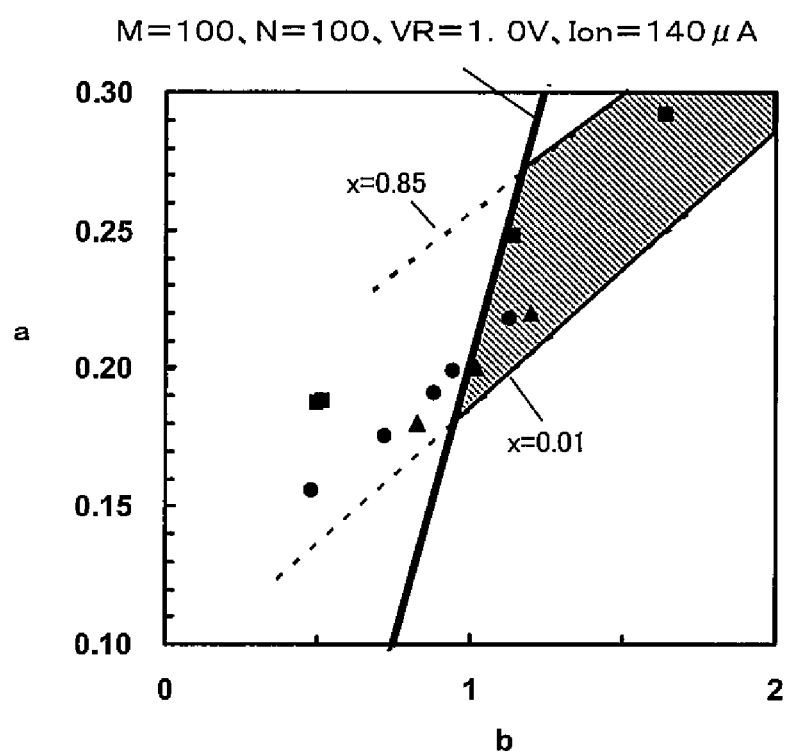
FIG. 15 is a view showing addition to FIG. 14B, of the range of the coefficient a and the range of the coefficient b which satisfy the formula (2), in a case where the number of bit lines is 100, the number of word lines is 100, a write voltage VR of the variable resistance element is 1.0V, and a write current $I_{on}$ of the variable resistance element is 140 (μA).

FIG. 15 is a view showing addition to FIG. 14B, of the range of the coefficient a and the range of the coefficient b which satisfy the formula (2), in a case where the number of bit lines is 100, the number of word lines is 100, the write voltage VR of the variable resistance element is 1.0V, and the write current $I_{on}$ of the variable resistance element is 140 (μA). A hatched portion in FIG. 15 is the range into which the coefficient a may fall and the range into which the coefficient b may fall, the coefficient a and the coefficient b satisfying the formula (2), in a case where the MSM current steering element including the current steering layer comprising $SiN_x$, is actually manufactured. An arbitrary combination of the coefficient a and the coefficient b which fall into the hatched portion in FIG. 15 is selected, the coefficient a and the coefficient b are substituted in the formula (12) and the formula (13), and these formulas are solved. In this way, the thickness d and the nitrogen content ratio x of the current steering layer comprising $SiN_x$ can be decided.

Figure 16:
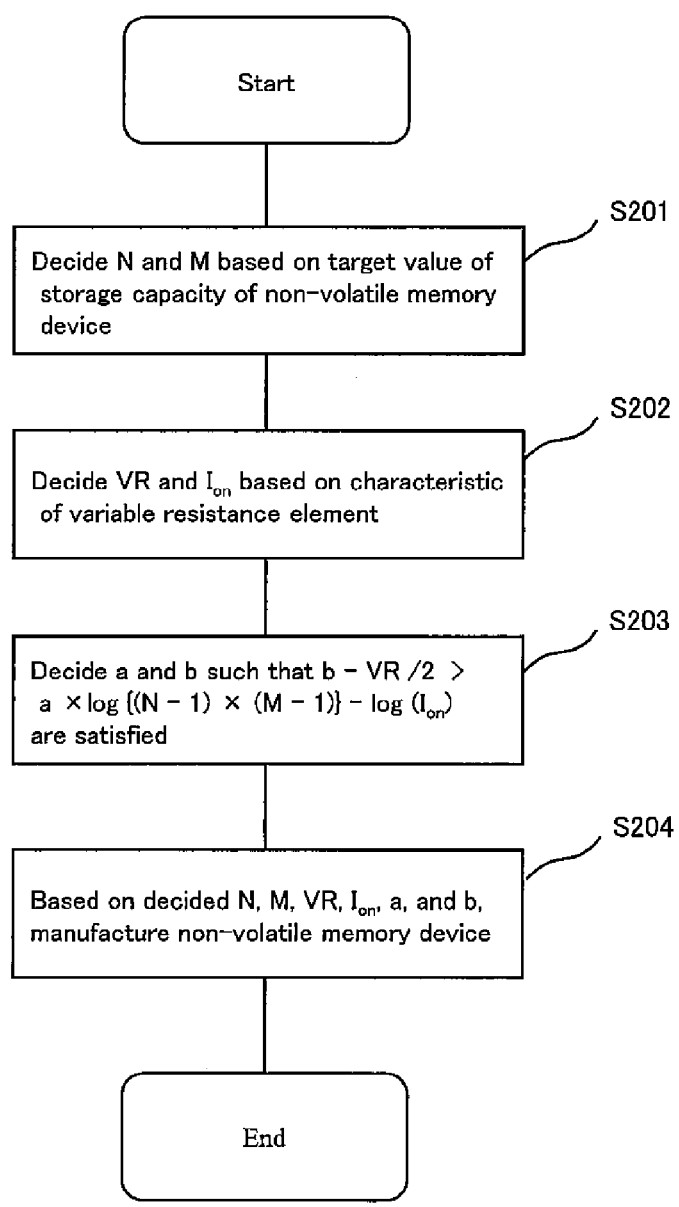
FIG. 16 is a schematic view showing an exemplary designing method and an exemplary manufacturing method of the non-volatile memory device according to Example 2.

FIG. 16 is a schematic view showing an exemplary designing method and an exemplary manufacturing method of the non-volatile memory device according to Example 2.

The designing method and the manufacturing method of the non-volatile memory device according to Example 2 is a designing method and a manufacturing method of a cross-point non-volatile memory device including memory elements arranged in (N×M) matrix, each of the memory elements including a variable resistance element and a bidirectional current steering element connected in series with the variable resistance element.

In Example 2, the variable resistance element is configured such that when a high-resistance state writing voltage is applied to the variable resistance element in a low-resistance state, it reversibly changes to a high-resistance state in which the variable resistance element has a greater resistance value than in the low-resistance state, while when a low-resistance state writing voltage different in polarity from the high-resistance state writing voltage is applied to the variable resistance element in the high-resistance state, it reversibly changes to the low-resistance state.

As shown in FIG. 16, in the manufacturing method of the non-volatile memory device of the present example, when an absolute value of the low-resistance state writing voltage is VR and an absolute value of a current flowing through the variable resistance element having changed to the low-resistance state by application of the low-resistance state writing voltage to both ends of the variable resistance element in the high-resistance state is $I_{on}$, and a relationship between the voltage $V_0$ applied to both ends of the bidirectional current steering element and a current I flowing through the bidirectional current steering element is approximated as $|V_0|$=a×Log(I)+b, initially, N and M are decided based on a target value of a storage capacity of the non-volatile memory device (step S201).

Then, VR and $I_{on}$ are decided based on the characteristic of the variable resistance element (step S202).

Then, as described above, using the formula (12) and the formula (13), the coefficient a and the coefficient b of the MSM current steering element including the current steering layer comprising $SiN_x$ are decided such that the formula (2) is satisfied (step S203).

Then, based on N, M, VR, $I_{on}$, a, and b found as described above, the non-volatile memory device is manufactured (step S204).

Numeral improvements and alternative embodiments of the present invention will be conceived by those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

Industrial Applicability

A designing method of a non-volatile memory device, a manufacturing method of the non-volatile memory device, and the non-volatile memory device of the present invention, are useful as, for example, a designing method of a non-volatile memory device, a manufacturing method of the non-volatile memory device, and the non-volatile memory device, which allow a variable resistance memory device to be practically designed with ease using a bipolar variable resistance element.

REFERENCE SIGNS LIST 1 variable resistance element
2 MSM current steering element
4 bit line decoder
5 read circuit 6 word line decoder
7 word line decoder
10 memory element
15 three-dimensional cross-point
20 non-volatile memory device
21 non-volatile memory device
22 memory element array
41 variable resistance element
42 MSM current steering element
100 substrate
101 first wire
102 first interlayer insulating layer
103 first contact hole
104 first contact plug
108 second interlayer insulating layer
109 second contact hole
110 second contact plug
111 second wire
201 first electrode
202 current steering layer
203 second electrode
301 third electrode
302 variable resistance layer
302B first transition metal oxide layer
302A second transition metal oxide layer
303 fourth electrode
400, 401, 402, 403, . . . , 433 memory element

The invention claimed is:

1. A method of designing a cross-point non-volatile memory device including memory elements arranged in (N ×M) matrix, each of the memory elements including a variable resistance element and a bidirectional current steering element connected in series with the variable resistance element,
the variable resistance element being configured such that when a high-resistance state writing voltage is applied to the variable resistance element in a low-resistance state, the variable resistance element reversibly changes to a high resistance state in which the variable resistance element has a greater resistance value than in the low-resistance state, while when a low-resistance state writing voltage different in polarity from the high-resistance state writing voltage is applied to the variable resistance element in the high-resistance state, the variable resistance element reversibly changes to the low-resistance state, the method comprising the step of:
when an absolute value of the low-resistance state writing voltage is VR and an absolute value of a current flowing through the variable resistance element having changed to the low-resistance state by application of the low-resistance state writing voltage to both ends of the variable resistance element in the high-resistance state is $I_{on}$, and a relationship between a voltage $V_0$ applied to both ends of the bidirectional current steering element and a current I flowing through the bidirectional current steering element is approximated as $|V_0|=a \times Log(I) +b$,
deciding N, M, VR, $I_{on}$, a, and b such that $b -VR/2 >a \times [Log\{(N-1)\times(M-1)\}-Log(I_{on})]$ is satisfied.

2. The method of designing the cross-point non-volatile memory device according to claim 1, further comprising the steps of:
deciding N and M based on a target value of a storage capacity of the non-volatile memory device;
deciding VR, $I_{on}$, and $I_{off}$ based on a characteristic of the variable resistance element; and
deciding a and b such that $b -VR/2 >a \times [Log\{(N-1)\times(M-1)\}-Log(I_{on})]$ is satisfied, based on the decided N, M, VR, and $I_{on}$, after deciding N and M and deciding VR, $I_{on}$, and $I_{off}$.

3. The method of designing the cross-point non-volatile memory device according to claim 1, wherein N, M, VR, $I_{on}$, a, and b are decided under a condition in which a >0.106.

4. The method of designing the cross-point non-volatile memory device according to claim 1, wherein N, M, VR, $I_{on}$, a, and b are decided under a condition in which b >0.

5. The method of designing the cross-point non-volatile memory device according to claim 1, wherein the bidirectional current steering element includes a first electrode, a second electrode, and a current steering layer interposed between the first electrode and the second electrode, and the current steering layer comprises $SiN_x$ (0 <x ≤0.85).

6. A method of manufacturing a cross-point non-volatile memory device, comprising the steps of:
designing the cross-point non-volatile memory device by the method of designing the cross-point non-volatile memory device as recited in any one of claims 1 to 5; and
manufacturing the cross-point non-volatile memory device based on the design;
wherein the cross-point non-volatile memory device includes:
memory elements arranged in (N ×M) matrix, each of the memory elements including a variable resistance element and a bidirectional current steering element connected in series with the variable resistance element,
wherein when the absolute value of the low-resistance state writing voltage is VR and the absolute value of the current flowing through the variable resistance element having changed to the low-resistance state by application of the low-resistance state writing voltage to both ends of the variable resistance element in the high-resistance state is $I_{on}$, and a relationship between the voltage $V_0$ applied to both ends of the bidirectional current steering element and the current I flowing through the bidirectional current steering element is approximated as $|V_0|=a \times Log(I) +b$, in a range of $I_{on} \times 10^{-3} \le I \le I_{on}$,
$b -VR/2 >a \times [Log\{(N-1)(M-1)\}-Log(I_{on})]$ is satisfied.

7. A cross-point non-volatile memory device comprising:
memory elements arranged in (N ×M) matrix;
each of the memory elements including a variable resistance element and a bidirectional current steering element connected in series with the variable resistance element;
the variable resistance element being configured such that when a high-resistance state writing voltage is applied to the variable resistance element in a low-resistance state, the variable resistance element reversibly changes to a high-resistance state in which the variable resistance element has a greater resistance value than in the low-resistance state, while when a low-resistance state writing voltage different in polarity from the high-resistance state writing voltage is applied to the variable resistance element in the high-resistance state, the variable resistance element reversibly changes to the low-resistance state;
wherein when an absolute value of the low-resistance state writing voltage is VR and an absolute value of a current flowing through the variable resistance element having changed to the low-resistance state by application of the low-resistance state writing voltage to both ends of the variable resistance element in the high-resistance state is $I_{on}$, and a relationship between a voltage $V_0$ applied to both ends of the bidirectional current steering element and a current I flowing through the bidirectional current steering element is approximated as $|V_0|=a \times Log(I) +b$, $b -VR/2 > a \times [Log\{(N-1)\times(M-1)\} -Log(I_{on})]$ is satisfied.

8. The cross-point non-volatile memory device according to claim 7, wherein $a > 0.106$.

9. The cross-point non-volatile memory device according to claim 7,
wherein $b > 0$.

10. The cross-point non-volatile memory device according to claim 7, wherein the bidirectional current steering element includes a first electrode, a second electrode, and a current steering layer interposed between the first electrode and the second electrode, and the current steering layer comprises $SiN_x$ ($0 < x \leq 0.85$).

11. The cross-point non-volatile memory device according to claim 7, wherein $a \geq 0.155$.

12. The cross-point non-volatile memory device according to claim 7, wherein $b \geq 0.48$.

13. The cross-point non-volatile memory device according to claim 7, wherein $0.155 \leq a \leq 0.291$.

14. The cross-point non-volatile memory device according to claim 7, wherein $0.48 \leq b\ 1.64$.

\* \* \* \* \*